United States Patent
Bash et al.

(10) Patent No.: US 7,051,946 B2
(45) Date of Patent: May 30, 2006

(54) AIR RE-CIRCULATION INDEX

(75) Inventors: Cullen Edwin Bash, San Francisco, CA (US); Ratnesh K. Sharma, Union City, CA (US); Chandrakant D. Patel, Fremont, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 6 days.

(21) Appl. No.: 10/446,854

(22) Filed: May 29, 2003

(65) Prior Publication Data

US 2004/0240514 A1    Dec. 2, 2004

(51) Int. Cl.
F24F 7/00    (2006.01)

(52) U.S. Cl. .................. 236/49.3; 165/80.3; 62/259.2

(58) Field of Classification Search .............. 164/80.2, 164/80.3, 80.4, 104.33; 62/259.2, 186; 236/49.3, 236/78 B; 165/80.2, 80.3, 80.4, 104.33, 165/249, 250, 251
See application file for complete search history.

(56) References Cited

U.S. PATENT DOCUMENTS

| | | | |
|---|---|---|---|
| 3,979,922 A * | 9/1976 | Shavit ....................... | 165/251 |
| 4,147,299 A * | 4/1979 | Freeman .................... | 165/249 |
| 4,164,172 A * | 8/1979 | Anderten et al. ........... | 165/249 |
| 6,104,003 A * | 8/2000 | Jones ...................... | 165/104.33 |
| 6,415,617 B1 * | 7/2002 | Seem ......................... | 62/186 |
| 6,574,104 B1 * | 6/2003 | Patel et al. ............. | 165/104.33 |
| 6,684,653 B1 * | 2/2004 | Des Champs et al. ........ | 62/186 |
| 6,694,759 B1 * | 2/2004 | Bash et al. ................ | 236/49.3 |
| 6,715,690 B1 * | 4/2004 | Hull et al. ................ | 236/78 D |

OTHER PUBLICATIONS

Sharma, Ratnesh K., Cullen E. Bash, Chandrakant D. Patel, "Dimensionless Parameters for Evaluation of Thermal Design and Performance of Large-Scale Data Centers", Jun. 24, 2002—American Institute of Aeronautics and Astronautics.

Bash, Cullen E., Chandrakant D. Patel, Ratnesh K. Sharma, "Efficient Thermal Management of Data Centers—Immediate and Long-Term Research Needs", Apr. 2003.

* cited by examiner

Primary Examiner—Harry B. Tanner
(74) Attorney, Agent, or Firm—Richard P. Lange

(57) ABSTRACT

An index of air re-circulation in a data center having one or more racks is determined to identify the level of heated air re-circulation into cooling fluid delivered to the one or more racks. The one or more racks comprise inlets and outlets and are positioned along a cool aisle and a hot aisle. The index is calculated by dividing the enthalpy rise due to infiltration of heated air into the cool aisle and the total enthalpy rise of the heated air from the outlets of the one or more racks.

30 Claims, 9 Drawing Sheets

AIR RE-CIRCULATION INDEX

BACKGROUND OF THE INVENTION

A data center may be defined as a location, e.g., room, that houses computer systems arranged in a number of racks. A standard rack, e.g., electronics cabinet, is defined as an Electronics Industry Association (EIA) enclosure, 78 in. (2 meters) wide, 24 in. (0.61 meter) wide and 30 in. (0.76 meter) deep. These racks are configured to house a number of computer systems, e.g., about forty (40) systems, with future configurations of racks being designed to accommodate up to eighty (80) systems. The computer systems typically include a number of components, e.g., one or more of printed circuit boards (PCBs), mass storage devices, power supplies, processors, micro-controllers, semi-conductor devices, and the like, that may dissipate relatively significant amounts of heat during the operation of the respective components. For example, a typical computer system comprising multiple microprocessors may dissipate approximately 250 W of power. Thus, a rack containing forty (40) computer systems of this type may dissipate approximately 10 KW of power.

The power required to transfer the heat dissipated by the components in the racks to the cool air contained in the data center is generally equal to about 10 percent of the power needed to operate the components. However, the power required to remove the heat dissipated by a plurality of racks in a data center is generally equal to about 50 percent of the power needed to operate the components in the racks. The disparity in the amount of power required to dissipate the various heat loads between racks and data centers stems from, for example, the additional thermodynamic work needed in the data center to cool the air. In one respect, racks are typically cooled with fans that operate to move cooling fluid, e.g., air, conditioned air, etc., across the heat dissipating components; whereas, data centers often implement reverse power cycles to cool heated return air. The additional work required to achieve the temperature reduction, in addition to the work associated with moving the cooling fluid in the data center and the condenser, often add up to the 50 percent power requirement. As such, the cooling of data centers presents problems in addition to those faced with the cooling of the racks.

Conventional data centers are typically cooled by operation of one or more air conditioning units. For example, compressors of air conditioning units typically require a minimum of about thirty (30) percent of the required operating energy to sufficiently cool the data centers. The other components, e.g., condensers, air movers (fans), etc., typically require an additional twenty (20) percent of the required cooling capacity. As an example, a high density data center with 100 racks, each rack having a maximum power dissipation of 10KW, generally requires 1 MW of cooling capacity. Air conditioning units with a capacity of 1 MW of heat removal generally requires a minimum of 300 KW input compressor power in addition to the power needed to drive the air moving devices, e.g., fans, blowers, etc. Conventional data center air conditioning units do not vary their cooling fluid output based on the distributed needs of the data center. Instead, these air conditioning units generally operate at or near a maximum compressor power even when the heat load is reduced inside the data center.

The substantially continuous operation of the air conditioning units is generally designed to operate according to a worst-case scenario. For example, air conditioning systems are typically designed around the maximum capacity and redundancies are utilized so that the data center may remain on-line on a substantially continual basis. However, the computer systems in the data center typically utilize around 30–50% of the maximum cooling capacity. In this respect, conventional cooling systems often attempt to cool components that are not operating at a level which may cause their temperatures to exceed a predetermined temperature range. Consequently, conventional cooling systems often incur greater amounts of operating expenses than may be necessary to sufficiently cool the heat generating components contained in the racks of data centers.

Another factor that affects the efficiency of the cooling systems is the level of air re-circulation present in the data center. That is, conventional cooling systems are not designed to reduce mixing of the cooling fluid with heated air. Thus, cooling fluid delivered to the racks generally mixes with air heated by the components thereby decreasing the efficiency of heat transfer from the components to the cooling fluid. In addition, heated air mixes with the cooling fluid thereby decreasing the temperature of the air returning to the air conditioning unit and thus decreases the efficiency of the heat transfer at the air conditioning unit.

SUMMARY OF THE INVENTION

According to an embodiment, the present invention pertains to a method for determining an index of air re-circulation in a data center having one or more racks. The one or more racks comprise inlets and outlets and are positioned along a cool aisle and a hot aisle. In the method, an enthalpy rise due to infiltration of heated air into the cool aisle and a total enthalpy rise of the heated air from the outlets of the one or more racks are determined. In addition, a first index value is generated by dividing the enthalpy rise due to infiltration of heated air into the cool aisle by the total enthalpy rise of the heated air from outlets of the one or more racks.

According to another embodiment, the present invention relates to a system for determining a re-circulation index value of airflow in a data center. The system includes a controller having a metrics module configured to determine an index value of air re-circulation in one or more locations of the data center.

According to a further embodiment, the present invention pertains to a method for controlling air re-circulation in a data center. In the method, inlet temperatures and outlet temperatures for one or more racks and a reference temperature are received. In addition, a first index value of air re-circulation is calculated based on the inlet and outlet temperatures and the reference temperature. Moreover, one or more actuators are manipulated in response to the calculated first index value of air re-circulation to thereby control air re-circulation in the data center.

According to a yet further embodiment, the present invention pertains to a method for controlling air re-circulation in a data center. In the method, a workload placement request is received and servers capable of performing the requested workload are identified. In addition, an index of air re-circulation is calculated on the identified servers and the workload is placed on the servers having the lowest index of air re-circulation.

According to a further embodiment, the present invention relates to a method for designing a data center. In the method, a data center configuration received and an index of air re-circulation for the data center configuration is calculated. In addition, the data center is re-configured to minimize values of the index of air re-circulation.

According to another embodiment, the present invention pertains to a system for controlling air re-circulation in a data center. The system includes means for calculating an index of air re-circulation in one or more areas of the data center and means for reducing air re-circulation in the one or more areas of the data center.

According to yet another embodiment, the present invention relates to a computer readable storage medium on which is embedded one or more computer programs. The one or more computer programs implement a method of controlling re-circulation of air in a data center. The one or more computer programs include a set of instructions for: receiving inlet temperatures and outlet temperatures for one or more racks; receiving a reference temperature; calculating a first index value of air re-circulation based on the inlet and outlet temperatures and the reference temperature; and manipulating one or more actuators in response to the calculated first index value of air re-circulation to thereby control air re-circulation in the data center.

BRIEF DESCRIPTION OF THE DRAWINGS

Features of the present invention will become apparent to those skilled in the art from the following description with reference to the figures, in which.

DETAILED DESCRIPTION OF THE INVENTION

Figure 1A:
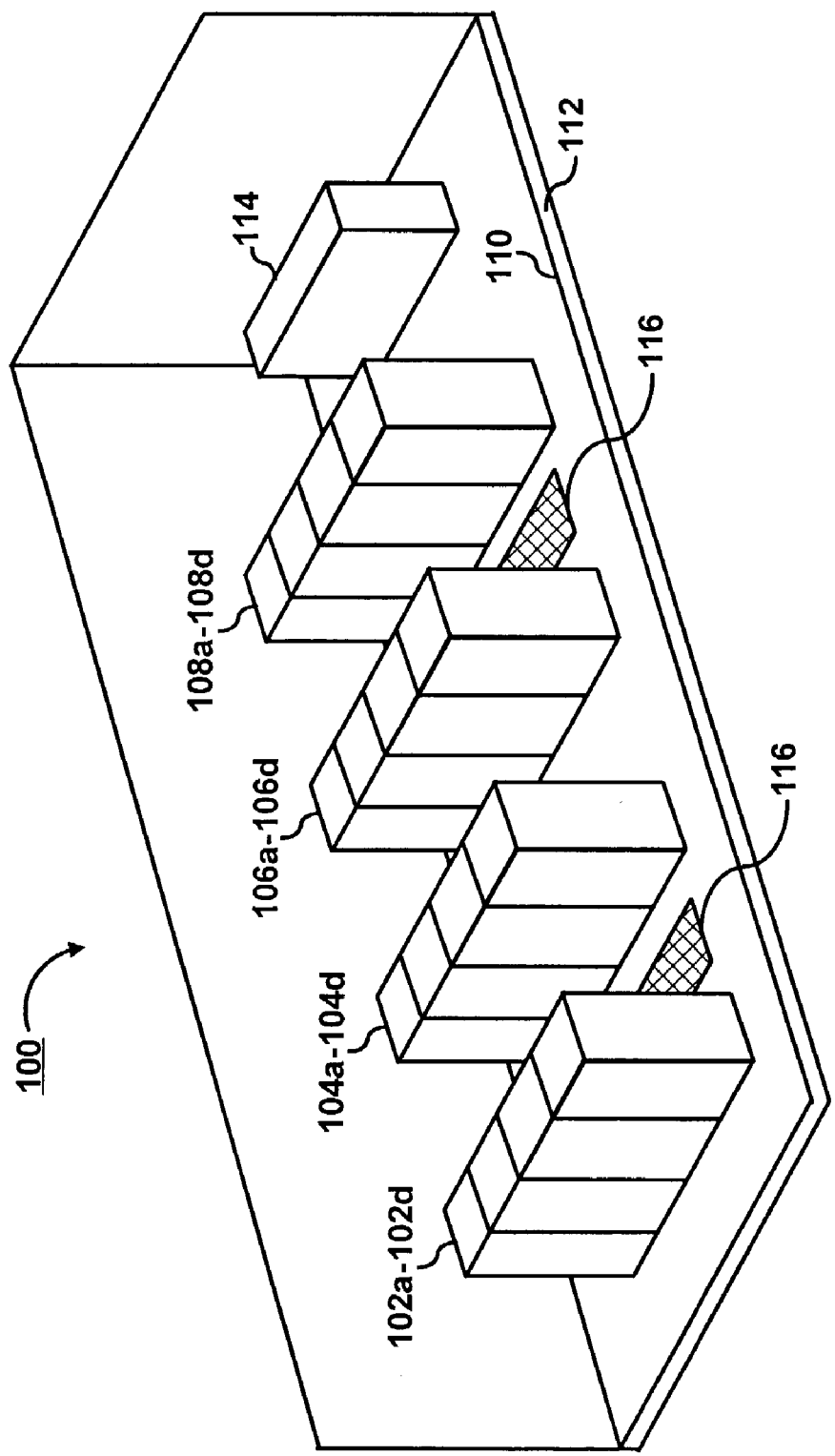
FIG. 1A shows a simplified perspective view of a data center according to an embodiment of the invention.

For simplicity and illustrative purposes, the present invention is described by referring mainly to an exemplary embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structures have not been described in detail so as not to unnecessarily obscure the present invention.

Throughout the present disclosure, reference is made to "cooling fluid" and "heated air". For purposes of simplicity, "cooling fluid" may generally be defined as air that has been cooled by a cooling device, e.g., an air conditioning unit. In addition, "heated air" may generally be defined as air, or cooling fluid, that has been heated, e.g., cooling fluid, that has received heat from a heat generating/dissipating component. It should be readily apparent, however, that the terms "cooling fluid" are not intended to denote air that only contains cooled air and that "heated air" only contains air that has been heated. Instead, embodiments of the invention may operate with air that contains a mixture of heated air and cooling fluid. In addition, cooling fluid and heated air may denote gases other than air, e.g., refrigerant and other types of gases known to those of ordinary skill in the art that may be used to cool electronic components.

According to an embodiment of the invention, dimensionless, scalable parameters may be calculated according to various environmental conditions within a data center. These parameters may be implemented to control one or more of cooling fluid delivery, heated air removal, and workload placement to provide efficient cooling of components in the data center. In one regard, cooling efficiency may be improved by reducing the amount of air re-circulation in the data center. That is, by reducing the re-circulation of heated air with cooling fluid and vice versa, the potential of the cooling fluid to cool the components in the data center may be improved over known cooling systems. One result of the efficiency improvement attainable through operation of embodiments of the invention is that the amount of energy required to operate cooling systems in the data center may be reduced, thereby reducing associated operating costs.

The non-dimensional parameters may be used to determine a scalable "index of performance" for the data center cooling system. In addition, the index of performance may quantify the amount of re-circulation occurring at various locations of the data center. In this regard, the parameters are disclosed throughout the present disclosure as a supply heat index (SHI) and a return heat index (RHI). The SHI and RHI may act as indicators of thermal management and energy efficiency of one or more components, a rack, a cluster of racks, or the data center as a whole.

The SHI and RHI are calculated based upon temperatures measured at various locations throughout the data center. For example, the temperature of the cooling fluid supplied by a computer room (e.g., data center) air conditioning unit may be implemented to determine SHI and RHI. The temperature of the cooling fluid supplied by the air conditioning unit may be considered as a reference temperature because the temperature of the cooling fluid at this point may substantially be controlled.

In addition, the indices may be based upon the temperatures at various inlets and outlets. By way of example, the temperatures may be measured at the inlet of a supply vent, the inlet of a rack, the outlet of a rack, the inlet of a return vent, etc. As will be described in greater detail hereinbelow, the temperatures at these various locations are functions of the geometrical layout of the data center. In addition, the temperatures may be varied according to various manipulations of the supply vents as well as the rack inlets and outlets.

According to further embodiments of the invention, the SHI and RHI may be computed with computational fluid dynamics modeling. This modeling may be performed to determine substantially optimized data center layouts. Thus, according to this embodiment of the invention, the layout of the data center may be designed for substantially optimal cooling system energy use. This may entail positioning the racks into predetermined configurations with respect to the supply vents and the air conditioning units. This may also entail use of racks having differing configurations for controlling airflow therethrough.

The SHI and RHI may be implemented in operating a data center cooling system. For example, the SHI and RHI may be used to control cooling fluid delivery to and/or heated air removal from the racks. As another example, the SHI and RHI may be used to determine substantially optimal computational load distribution among the racks. That is, based upon the SHI and RHI calculations, computing workload performed by one or more components, e.g., servers, computers, etc., located in the racks may be shared by one or more other components. Alternatively, the computing workload distributed among a lesser number of components.

With reference first to FIG. 1A, there is shown a simplified perspective view of a data center 100 according to an embodiment of the invention. The terms "data center" are generally meant to denote a room or other space where one or more components capable of generating heat may be situated. In this respect, the terms "data center" are not meant to limit the invention to any specific type of room where data is communicated or processed, nor should it be construed that use of the terms "data center" limits the invention in any respect other than its definition hereinabove.

It should be readily apparent to those of ordinary skill in the art that the data center 100 depicted in FIG. 1A represents a generalized illustration and that other components may be added or existing components may be removed or modified without departing from the scope of the invention. For example, the data center 100 may include any number of racks and various other components. In addition, it should be understood that heat generating/dissipating components may be located in the data center 100 without being housed in racks.

The data center 100 is depicted as having a plurality of racks 102–108, e.g., electronics cabinets, aligned in parallel rows. Each of the rows of racks 102–108 is shown as containing four racks (a–d) positioned on a raised floor 110. A plurality of wires and communication lines (not shown) may be located in a space 112 beneath the raised floor 110. The space 112 may also function as a plenum for delivery of cooling fluid from an air conditioning unit 114 to the racks 102–108. The cooling fluid may be delivered from the space 112 to the racks 102–108 through vents 116 located between some or all of the racks 102–108. The vents 116 are shown as being located between racks 102 and 104 and 106 and 108.

The racks 102–108 are generally configured to house a plurality of components capable of generating/dissipating heat (not shown), e.g., processors, micro-controllers, high-speed video cards, memories, semi-conductor devices, and the like. The components may be elements of a plurality of subsystems (not shown), e.g., computers, servers, etc. The subsystems and the components may be implemented to perform various electronic, e.g., computing, switching, routing, displaying, and the like, functions. In the performance of these electronic functions, the components, and therefore the subsystems, may generally dissipate relatively large amounts of heat. Because the racks 102–108 have generally been known to include upwards of forty (40) or more subsystems, they may transfer substantially large amounts of heat to the cooling fluid to maintain the subsystems and the components generally within predetermined operating temperature ranges.

Although the data center 100 is illustrated as containing four rows of racks 102–108 and an air conditioning unit 114, it should be understood that the data center 100 may include any number of racks, e.g., 100 racks, and air conditioning units, e.g., four or more. The depiction of four rows of racks 102–108 and an air conditioning unit 114 is for illustrative and simplicity of description purposes only and is not intended to limit the invention in any respect.

Figure 1B:
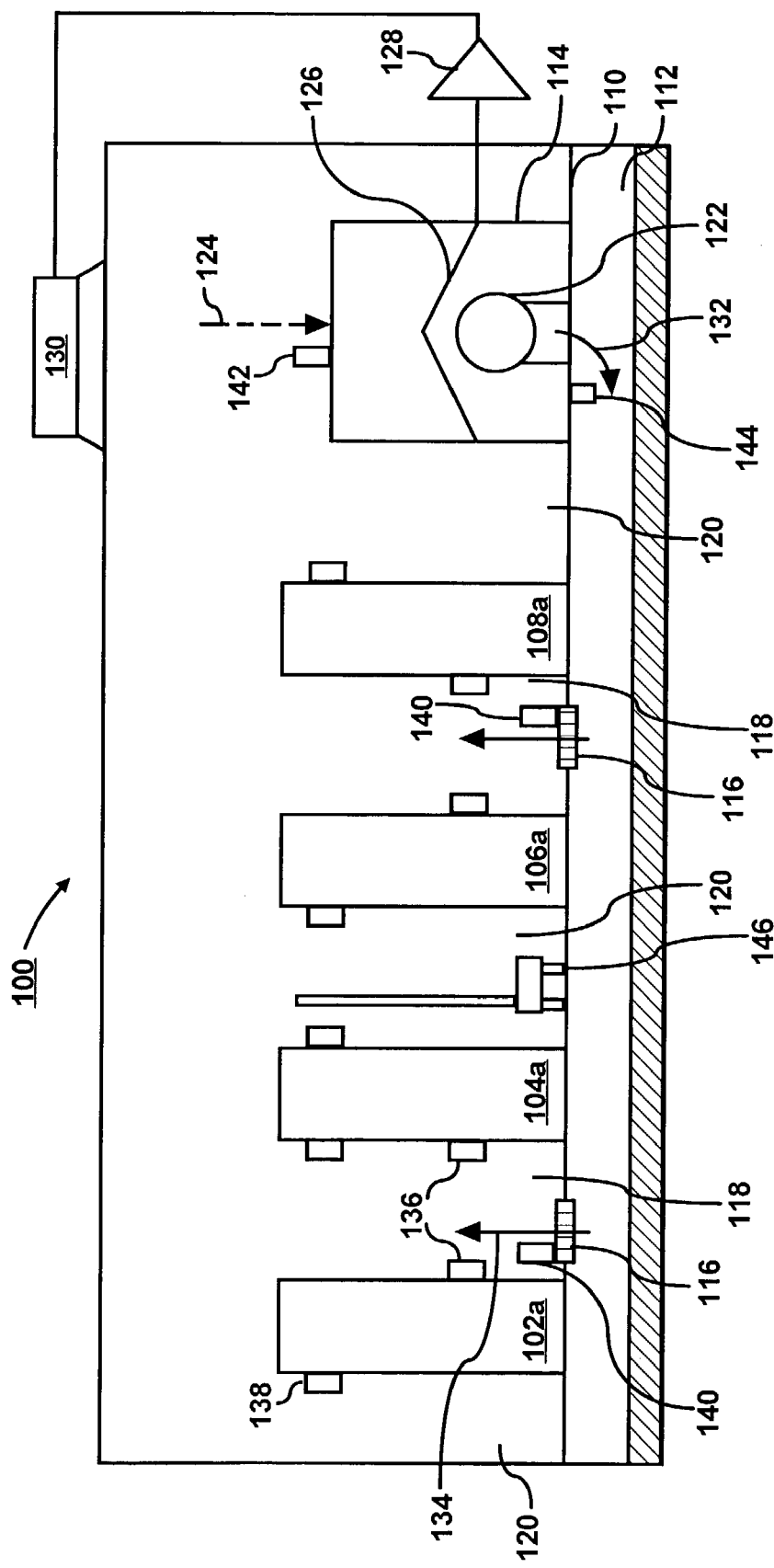
FIG. 1B shows a simplified illustration of a side elevational view of the data center shown in FIG. 1A, according to an embodiment of the invention.

With reference now to FIG. 1B, there is shown a simplified illustration of a side elevational view of the data center 100 shown in FIG. 1A, according to an embodiment of the invention. In FIG. 1B, racks 102a, 104a, 106a, and 108a are visible. A more detailed description of the embodiments illustrated with respect to FIG. 1B may be found in co-pending and commonly assigned U.S. application Ser. No. 09/970,707, filed on Oct. 5, 2001, which is hereby incorporated by reference in its entirety.

As shown in FIG. 1B, the areas between the racks 102 and 104 and between the racks 106 and 108 may comprise cool aisles 118. These aisles are considered "cool aisles" because they are configured to receive cooling fluid from the vents 116. In addition, the racks 102–108 generally receive cooling fluid from the cool aisles 118. The aisles between the racks 104 and 106, and on the rear sides of racks 102 and 108, are considered hot aisles 120. These aisles are considered "hot aisles" because they are positioned to receive air heated by the components in the racks 102–108. By substantially separating the cool aisles 118 and the hot aisles 120, e.g., with the racks 102–108, the cooling fluid may substantially be prevented from re-circulating with the heated air prior to delivery into the racks 102–108.

The sides of the racks 102–108 that face the cool aisles 118 may be considered as the fronts of the racks and the sides of the racks 102–108 that face away from the cool aisles 118 may be considered as the rears of the racks. For purposes of simplicity and not of limitation, this nomenclature will be relied upon throughout the present disclosure to describe the various sides of the racks 102–108.

According to another embodiment of the invention, the racks 102–108 may be positioned with their rear sides adjacent to one another (not shown). In this embodiment, vents 116 may be provided in each aisle 118 and 120. In addition, the racks 102–108 may comprise outlets on top panels thereof to enable heated air to flow out of the racks 102–108.

As described hereinabove, the air conditioning unit 114 receives heated air and cools the heated air. In addition, the air conditioning unit 114 supplies the racks 102–108 with air that has been cooled, e.g., cooling fluid, through, for example, a process as described below. The air conditioning unit 114 generally includes a fan 122 for supplying cooling fluid (e.g., air) into the space 112 (e.g., plenum) and/or drawing air from the data center 100 (e.g., as indicated by the arrow 124). In operation, the heated air enters into the air conditioning unit 114 as indicated by the arrow 124 and is cooled by operation of a cooling coil 126, a compressor 128, and a condenser 130, in a manner generally known to those of ordinary skill in the art. In terms of cooling system efficiency, it is generally desirable that the return air is composed of the relatively warmest portion of air in the data center 100.

Although reference is made throughout the present disclosure of the use of a fan 122 to draw heated air from the data center 100, it should be understood that any other reasonably suitable manner of air removal may be implemented without departing from the scope of the invention. By way of example, a fan (not shown) separate from the fan 122 or a blower may be utilized to draw air from the data center 100.

In addition, based upon the cooling fluid needed to cool the heat loads in the racks 102–108, the air conditioning unit 114 may be operated at various levels. For example, the capacity (e.g., the amount of work exerted on the refrigerant) of the compressor 128 and/or the speed of the fan 122 may be modified to thereby control the temperature and the amount of cooling fluid flow delivered to the racks 102–108. In this respect, the compressor 128 may comprise a variable capacity compressor and the fan 122 may comprise a variable speed fan. The compressor 128 may thus be controlled to either increase or decrease the mass flow rate of a refrigerant therethrough.

Because the specific type of compressor 128 and fan 122 to be employed with embodiments of the invention may vary according to individual needs, the invention is not limited to any specific type of compressor or fan. Instead, any reasonably suitable type of compressor 128 and fan 122 that are capable of accomplishing certain aspects of the invention may be employed with the embodiments of the invention. The choice of compressor 128 and fan 122 may depend upon a plurality of factors, e.g., cooling requirements, costs, operating expenses, etc.

It should be understood by one of ordinary skill in the art that embodiments of the invention may be operated with constant speed compressors and/or constant speed fans. In one respect, control of cooling fluid delivery to the racks 102–108 may be effectuated based upon the pressure of the cooling fluid in the space 112. According to this embodiment, the pressure within the space 112 may be controlled through operation of, for example, a plurality of vents 116 positioned at various locations in the data center 100. That is, the pressure within the space 112 may be kept essentially constant throughout the space 112 by selectively controlling the output of cooling fluid through the vents 116. By way of example, if the pressure of the cooling fluid in one location of the space 112 exceeds a predetermined level, a vent located substantially near that location may be caused to enable greater cooling fluid flow therethrough to thereby decrease the pressure in that location. A more detailed description of this embodiment may be found in U.S. application Ser. No. 10/303,761, filed on Nov. 26, 2002 and U.S. application Ser. No. 10/351,427, filed on Jan. 27, 2003, which are assigned to the assignee of the present invention and are hereby incorporated by reference in their entireties.

In addition, or as an alternative to the compressor 128, a heat exchanger (not shown) may be implemented in the air conditioning unit 114 to cool the fluid supply. The heat exchanger may comprise a chilled water heat exchanger, a centrifugal chiller (e.g., a chiller manufactured by YORK), and the like, that generally operates to cool air as it passes over the heat exchanger. The heat exchanger may comprise a plurality of air conditioners. The air conditioners may be supplied with water driven by a pump and cooled by a condenser or a cooling tower. The heat exchanger capacity may be varied based upon heat dissipation demands. Thus, the heat exchanger capacity may be decreased where, for example, it is unnecessary to maintain the cooling fluid at a relatively low temperature.

In operation, cooling fluid generally flows from the fan 122 into the space 112 as indicated by the arrow 132. The cooling fluid flows out of the raised floor 110 and into various areas of the racks 102–108 through the plurality of vents 116 as indicated by the arrows 134. The vents 116 may comprise the dynamically controllable vents disclosed and described in co-pending U.S. application Ser. No. 09/970,707. As described in that application, the vents 116 are termed "dynamically controllable" because they generally operate to control at least one of velocity, volume flow rate and direction of the cooling fluid therethrough. In addition, specific examples of dynamically controllable vents 116 may be found in co-pending U.S. application Ser. No. 10/375,003, filed on Feb. 28, 2003, which is assigned to the assignee of the present invention and is incorporated by reference herein in its entirety.

As the cooling fluid flows out of the vents 116, the cooling fluid may flow into the racks 102–108. The racks 102–108 generally include inlets (not shown) on their front sides to receive the cooling fluid from the vents 116. The inlets generally comprise one or more openings to enable the cooling fluid to enter the racks 102–108. In addition, or alternatively, the front sides of some or all of the racks 102–108 may comprise devices for substantially controlling the flow of cooling fluid into the racks 102–108. Examples of suitable devices are described in co-pending and commonly assigned U.S. Patent Application Serial Nos., 10/425,621 and 10/425,624, both of which were filed on Apr. 30, 2003, the disclosures of which are hereby incorporated by reference in their entireties.

The cooling fluid may become heated by absorbing heat dissipated from components located in the racks 102–108 as it flows through the racks 102–108. The heated air may generally exit the racks 102–108 through one or more outlets located on the rear sides of the racks 102–108. In addition, or alternatively, the rear sides of some or all of the racks 102–108 may comprise devices for substantially controlling the flow of cooling fluid into the racks 102–108 and/or controlling the flow of heated air out of the racks 102–108. Again, examples of suitable devices are described in co-pending and commonly assigned U.S. patent application Ser. Nos., 10/425,621 and 10/425,624.

The flow of air through the racks 102–108 may substantially be balanced with the flow of air through the vents 116 through operation of the above-described devices in manners consistent with those manners set forth in the above-identified co-pending applications. In addition, a proportional relationship may be effectuated between the airflow through the racks 102–108 and the vents 116. By virtue of controlling the airflow in the manners described in those co-pending applications, the level of re-circulation between the heated air flow and the cooling fluid may substantially be reduced or eliminated in comparison with known cooling systems.

The air conditioning unit 114 may vary the amount of cooling fluid supplied to the racks 102–108 as the cooling requirements vary according to the heat loads in the racks 102–108, along with the subsequent variations in the volume flow rate of the cooling fluid. As an example, if the heat loads in the racks 102–108 generally increases, the air conditioning unit 114 may operate to increase one or more of the supply and temperature of the cooling fluid. Alternatively, if the heat loads in the racks 102–108 generally decreases, the air conditioning unit 114 may operate to decrease one or more of the supply and temperature of the cooling fluid. In this regard, the amount of energy utilized by the air conditioning unit 114 to generally maintain the components in the data center 100 within predetermined operating temperature ranges may substantially be optimized.

As an alternative, there may arise situations where the additional cooling fluid flow to the racks 102–108 causes the temperatures of the components to rise. This may occur, for example, when a relatively large amount of heated air is re-circulated into the cooling fluid. In this situation, and as will be described in greater detail hereinbelow, cooling fluid delivery may be reduced in response to increased component temperatures. In addition, cooling fluid delivery may be increased in response to decreased component temperatures. It should therefore be understood that the present invention is not limited to one operational manner as temperatures in the data center 100 vary.

Through operation of the vents 116, the above-described devices, and the air conditioning unit 114, global and zonal control of the cooling fluid flow and temperature may be achieved. For instance, the vents 116 and the above-described devices generally provide localized or zonal control of the cooling fluid flow to the racks 102–108. In addition, the air conditioning unit 114 generally provides global control of the cooling fluid flow and temperature throughout various portions of the data center 100. By virtue of the zonal and global control of the cooling fluid, the amount of energy consumed by the air conditioning unit 114 in maintaining the components of the racks 102–108 within predetermined operating temperature ranges may substantially be reduced in comparison with conventional data center cooling systems.

A plurality of temperature sensors 136–144, e.g., thermistors, thermocouples, etc., may be positioned at various locations throughout the data center 100. By way of example, temperature sensors 136 may be provided at the inlets of the racks 102–108 to detect the temperature of the cooling fluid delivered into the racks 102–108. Temperature sensors 138 may be provided at the outlets of the racks 102–108 to detect the temperature of the heated air exhausted from the racks 102–108. Temperature sensors 140 may further be located at the vents 116 to detect the temperature of the cooling fluid supplied from the space 112. In addition, temperature sensors 142, 144 may respectively be positioned near the inlet and outlet of the air conditioning unit 114 to respectively detect the temperatures of the heated air entering the air conditioning unit 114 and the cooling fluid delivered to the space 112.

The temperature sensors 136–144 may communicate with one another and/or a computer configured to control operations of the data center cooling system (e.g., air conditioning unit 114, vents 116, etc.). The communication may be effectuated via a wired protocol, such as IEEE 802.3, etc., wireless protocols, such as IEEE 801.11b, 801.11g, wireless serial connection, Bluetooth, etc., or combinations thereof. In addition, or alternatively, one or more of the temperature sensors 136–144 may comprise location aware devices as described in co-pending and commonly assigned U.S. patent application Ser. No. 10/620,272, filed on Jul. 9, 2003, entitled "LOCATION AWARE DEVICES", the disclosure of which is hereby incorporated by reference in its entirety. As described in that application, these devices are termed "location aware" because they are operable to determine their general locations with respect to other sensors and/or devices and to communicate with one another through wireless communications.

According to another embodiment of the invention, a mobile device 146 may be provided to gather or measure at least one environmental condition (e.g., temperature, pressure, air flow, humidity, location, etc.) in the data center 100. More particularly, the mobile device 146 may be configured to travel around the racks 102–108 to determine the one or more environmental conditions at various locations throughout the data center 100. In this regard, the mobile device 146 may enable temperatures in the data center 100 to be detected at various locations thereof while requiring substantially fewer temperature sensors. A more detailed description of the mobile device 146 and its operability may be found in co-pending and commonly assigned U.S. application Ser. No. 10/157,892, filed on May 31, 2002, the disclosure of which is hereby incorporated by reference in its entirety.

As described in the Ser. No. 10/157,892 application, the mobile device 146 may be a self-propelled mechanism configured for motivation around the racks 102–108 of the data center 100. In addition, the mobile device 146 generally includes a plurality of sensors configured to detect one or more environmental conditions at various heights. The mobile device 146 may transmit the environmental condition information to an air conditioning unit controller (not shown) which may utilize the information in determining delivery of cooling fluid to the racks 102–108 in the data center 100. In addition, the mobile device 146 may transmit the environmental condition information to vent controllers (not shown) configured to operate the vents 116. According to another embodiment, the mobile device 146 may receive environmental information from temperature sensors comprising configurations similar to the location aware device described hereinabove. For example, the sensors may transmit a temperature measurement to the mobile device 146 indicating a hot spot, e.g., a location where the temperature is substantially above normal. The mobile device 146 may alter its course to travel to the detected hot spot to verify the temperature measurement by the sensors.

Figure 1C:
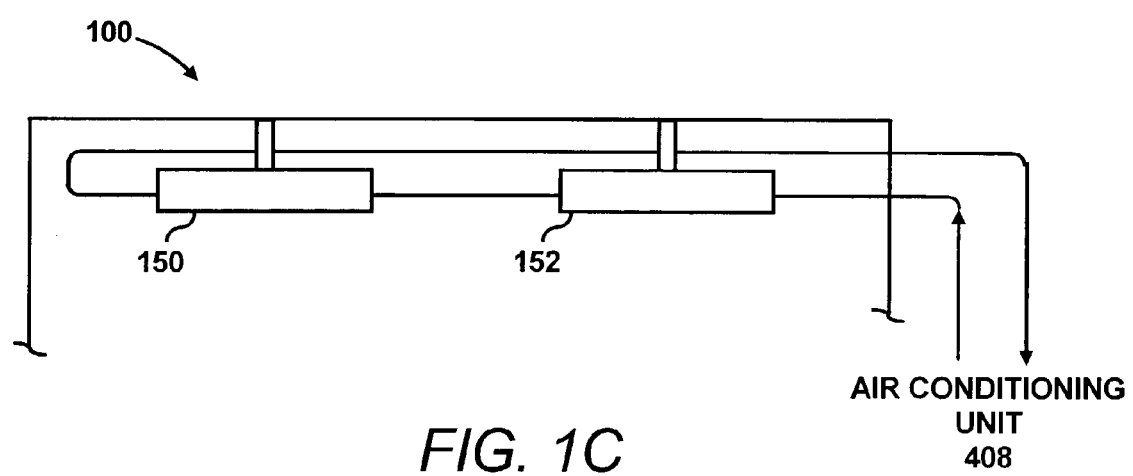
FIG. 1C is a cross-sectional side view of an upper portion of a data center according to an embodiment of the invention.

FIG. 1C is a cross-sectional side view of an upper portion of a data center 100 according to an embodiment of the invention. As illustrated in FIG. 1C, heat exchanger units (HEU's) 150 and 152 may be provided in the data center 100. The HEU's 150 and 152 are disclosed and described in co-pending U.S. application Ser. No. 10/210,040, filed on Aug. 2, 2002, which is assigned to the assignee of the present invention and is hereby incorporated by reference in its entirety. As described in the Ser. No. 10/210,040 application, the HEU's 150 and 152 generally operate to receive heated air from the racks 102–108, cool the received air, and deliver the cooled air back to the racks 102a–108a in a substantially controlled manner. The HEU's 150 and 152 are configured to have refrigerant flow therethrough from the air conditioning unit 114 to cool the heated air they receive. The HEU's 150 and 152 generally include an opening to receive the heated air and one or more fans to return the cooled air back to the racks 102–108. In addition, the HEU's 150 and 152 may also include temperature sensors (not shown) or temperature sensors may be located in the vicinities of the HEU's 150 and 152.

The temperatures detected by the sensors 136–144, the mobile device 146, and/or the temperature sensors located near the HEU's 150 and 152, may be implemented to determine metrics of re-circulation in the data center 100. The metrics may be defined as a supply heat index (SHI) and a return heat index (RHI). The SHI may be defined as a measure of the infiltration of heated air into the cooling fluid and may be determined according to the following equation:

equation (1):

$$SHI = \frac{\delta Q}{Q + \delta Q}$$

Where Q represents the total heat dissipation from all the components in the racks 102–108 of the data center 100 and δQ represents the rise in enthalpy of the cooling fluid before entering the racks 102–108.

The total heat dissipation may be determined by averaging the values obtained from subtracting the temperatures at the outlets of the racks 102–108 as detected by the temperature sensors 138 from the temperatures at the inlets of the racks 102–108 as detected by the temperature sensors 140. The total heat dissipation Q and the rise in enthalpy δQ of the cooling fluid may be determined by the following equations:

equation (2):
$$Q = \sum_j \sum_i m^r_{i,j} C_p \left((T^r_{out})_{i,j} - (T^r_{in})_{i,j}\right)$$

equation (3):
$$\delta Q = \sum_j \sum_i m^r_{i,j} C_p \left((T^r_{in})_{i,j} - T_{ref}\right)$$

Where $m^r_{i,j}$ is the mass flow rate through the ith rack in the jth row of racks and $(T^r_{in})_{i,j}$ and $(T^r_{out})_{i,j}$ are average inlet and outlet temperatures from the ith rack in the jth row of racks. In addition, $T_{ref}$ denotes the vent 116 air temperature which is assumed to be identical for all the cool aisles 118.

The numerator in equation 1 denotes the sensible heat gained by the air in the cool aisles before entering the racks while the denominator represents the total sensible heat gain by the air leaving the rack exhausts. Because the sum of the mass flow rates is equal for equations 2 and 3, SHI may be written as a function of rack inlet, rack outlet and air conditioning unit 114 outlet temperatures. Thus, SHI may be represented as follows:

equation (4):
$$SHI = \left( \frac{\sum_j \sum_i \left((T^r_{in})_{i,j} - T_{ref}\right)}{\sum_j \sum_i \left((T^r_{out})_{i,j} - T_{ref}\right)} \right)$$

SHI may also be calculated for a cluster of racks in an aisle to evaluate the infiltration of heat into specific cool aisles. Moreover, SHI may be calculated for individual racks to isolate areas susceptible to hot spots. Equations 1 and 3 indicate that higher δQ leads to higher $(T^r_{in})_{i,j}$ and hence, a higher SHI. When the inlet temperature $T^r_{in}$ to the rack rises relative to $T_{ref}$, systems become more vulnerable to failure and reliability problems. Increased $T^r_{in}$ also signifies increased entropy generation due to mixing and reduced energy efficiency for the data center 100. Therefore SHI can be an indicator of thermal management and energy efficiency in a rack, a cluster of racks, or the data center.

An SHI of zero indicates a prefect system with no re-circulation of heated air into the cooling fluid. Therefore, according to an embodiment of the invention, one goal in operating the components of a data center cooling system is to minimize SHI.

The heated air from the rack 102–108 exhausts is drawn up into the ceiling space of the data center 100. The heated air then flows into the inlet of the air conditioning unit 114. During this flow, the heated air may mix with the cooling fluid from the cool aisles 118 and may thus lose some of its heat. The quantity of heat loss in this process is equal to the secondary heat acquired by the air in the cool aisles 118. From overall heat balance in the data center 100, the total heat dissipation (Q) from all the racks 102–108 should be equal to the total cooling load of the air conditioning unit 114. Therefore, the heat balance in the data center between the rack exhausts and the air conditioning unit 114 inlet may be written as follows:

equation (5):
$$\delta Q = \sum_j \sum_i m^r_{i,j} C_p \left((T^r_{out})_{i,j} - T_{ref}\right) - \sum_k M_k C_p \left((T^c_{in})_k - T_{ref}\right)$$

Where $M_k$ is the mass flow rate of air through an air conditioning unit, e.g., air conditioning unit 114, and $T^c_{in}$ is the individual air conditioning unit inlet temperature.

In equation 5, the first term in the right hand side denotes the total enthalpy (Q+δQ) of the heated air exhausted from the racks 102–108. The second term denotes the decrease in enthalpy due to mixing of heated air and cooling fluid air streams. Normalizing equation 5 with respect to the total exhaust air enthalpy and rearranging yields:

$$SHI+RHI=1 \quad \quad \text{equation (6)}$$

Where RHI is the return heat index and is defined by the following equation:

equation (7):
$$RHI = \left( \frac{Q}{Q+\delta Q} \right) = \frac{\sum_k M_k C_p \left((T^c_{in})_k - T_{ref}\right)}{\sum_j \sum_i m^r_{i,j} C_p \left((T^r_{out})_{i,j} - T_{ref}\right)}$$

In equation 7, the numerator denotes the total heat extraction by the air conditioning unit(s) 114 and the denominator denotes the total enthalpy rise at the rack exhaust. Since the heat extracted by the air conditioning unit(s) 114 is also equal to the heat dissipation from the racks, the numerator represents the effective heat dissipation in the data center 100.

An increase in $T^r_{in}$ generally results in a rise in $T^r_{out}$ on the return side of the racks, provided the heat load in the racks is constant. For equation 7, it is apparent that this change in temperature would reduce RHI, indicating that the air undergoes a higher degree of mixing before reaching the air conditioning unit(s) 114. Heated air from the rack exhausts may mix with cooling fluid inside the hot aisle, in the ceiling space, or in the space between the racks and the walls. To investigate local mixing in each row, RHI can be evaluated in an aisle-based control volume between the aisle exhaust and the rack exhaust or it can be inferred from calculation of SHI through known temperature data and equation 6. Higher values of RHI generally indicate better aisle designs with low mixing levels.

According to an embodiment of the invention, data center cooling systems components may be operated in manners to generally increase RHI values.

A more detailed description of the equations above along with examples in which SHI and RHI may be used in the context of data centers may be found in a pair of articles published by the inventors of the present invention. The first article was published in the American Institute of Aeronautics and Astronautics on Jun. 24, 2002, and is entitled "Dimensionless Parameters for Evaluation of Thermal Design and Performance of Large-Scale Data Centers." The second article was published in the April 2003 edition of the International Journal of Heat, Ventilating, Air-conditioning and Refrigeration Research, and is entitled "Efficient Thermal Management of Data Centers—Immediate and Long-Term Research Needs." The disclosures contained in these articles are hereby incorporated by reference in their entireties.

Figure 2:
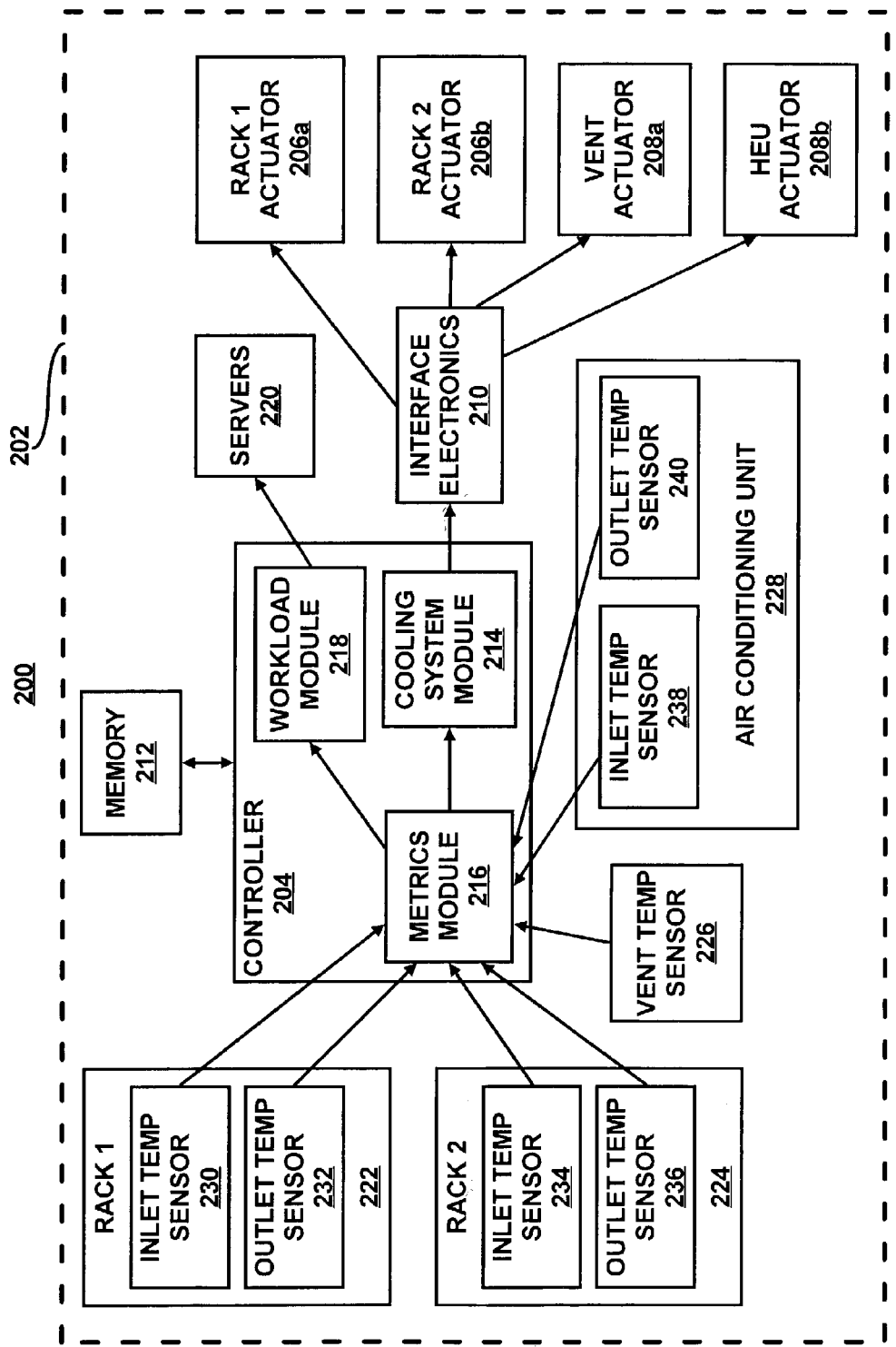
FIG. 2 is an exemplary block diagram for a cooling system according to an embodiment of the invention.

FIG. 2 is an exemplary block diagram 200 for a cooling system 202 according to an embodiment of the invention. It should be understood that the following description of the block diagram 200 is but one manner of a variety of different manners in which such a cooling system 202 may be operated. In addition, it should be understood that the cooling system 202 may include additional components and that some of the components described may be removed and/or modified without departing from the scope of the invention.

The cooling system 202 includes a controller 204 configured to control the operations of the cooling system 202. By way of example, the controller 204 may control actuators 206a, 206b for a first rack 222 and a second rack 224, a vent actuator 208a, and/or a HEU actuator 208b to vary airflow characteristics in the data center 100. As another example, the controller 204 may control the workload placed on various servers 220 in the data center 100. The controller 204 may comprise a microprocessor, a micro-controller, an application specific integrated circuit (ASIC), and the like.

The first rack actuator 206a and the second rack actuator 206b may be configured to manipulate an apparatus configured to vary the airflow through the racks, e.g., racks 102–108. Examples of suitable actuators 206a, 206b and apparatus may be found in co-pending U.S. patent application Ser. Nos. 10/425,621 and 10/425,624. As described in those patent applications, a louver assembly or an angled panel may be provided on a rack and may be operated to vary the airflow through the racks.

The vent actuator 208a may comprise an actuator configured to vary the airflow through the vent. Examples of suitable vent actuators 208a and vents configured to vary the airflow therethrough may be found in co-pending and commonly assigned U.S. patent application Ser. No. 10/375,003, filed on Feb. 28, 2003, the disclosure of which is hereby incorporated by reference in its entirety. A discussion of various operational modes for these types of vents is disclosed in U.S. patent application Ser. No. 09/970,707.

The HEU actuator 208b may comprise an actuator configured to vary the airflow into and out of the HEU's 150 and 152. For instance, the actuator 208b may be configured to operate the one or more fans of the HEU's 150 and 152. Examples of suitable HEU actuators 208b may be found in the above-identified application Ser. No. 10/210,040. Interface electronics 210 may be provided to act as an interface between the controller 204 and the first rack actuator 206a, second rack actuator 206b, the vent actuator 208a, and the HEU actuator 208b. The interface electronics 210 may instruct the first rack actuator 206a, second rack actuator 206b, and/or the vent actuator 208a to vary its configuration to thereby vary the airflow therethrough and thus through the racks. By way of example, the interface electronics 210 may vary the voltage supplied to the vent actuator 208a to vary the direction and/or magnitude of rotation of a drive shaft of the vent actuator 208a in accordance with instructions from the controller 204.

The controller 204 may also be interfaced with a memory 212 configured to provide storage of a computer software that provides the functionality of the cooling system 202.

The memory 212 may be implemented as a combination of volatile and non-volatile memory, such as DRAM, EEPROM, flash memory, and the like. The memory 212 may also be configured to provide a storage for containing data/information pertaining to the manner in which the rack actuators 206a and 206b, the vent actuator 208a, and the HEU actuator 208b may be manipulated in response to, for example, calculated SHI determinations.

The controller 204 may contain a cooling system module 214 configured to transmit control signals to the interface electronics 210. The cooling system module 214 may receive instructions from a metrics module 216 configured to calculate one or both of SHI and RHI. SHI and RHI may be calculated in manners set forth hereinabove with respect to FIG. 1B. The controller 204 may also comprise a workload module 218 configured to communicate with the metrics module 216. The workload module 218 may operate to distribute workload between a plurality of servers 220 in response to the calculated one or both of SHI and RHI.

In one respect, the cooling system module 214 may transmit instructions for the rack actuators 206a and 206b, the vent actuator 208a, and/or the HEU actuator 208b to become manipulated in a manner to generally reduce SHI. In addition, these instructions may be directed to generally increasing RHI. In addition, or in the alternative, the workload module 218 may distribute the workload among various servers 220 to generally reduce SHI values and/or generally increase RHI values.

As described hereinabove, the SHI values and RHI values may be calculated based upon the temperatures of cooling fluid and heated air at various locations of the data center. In one regard, the temperatures implemented in calculating SHI may be detected at the rack inlets and outlets, vents, and the air conditioning unit inlet and outlet.

FIG. 2 illustrates two racks 222 and 224, a vent temperature sensor 226, and an air conditioning unit 228 for purposes of simplicity of description and not of limitation. It should, however, be understood that the following description of the block diagram 200 may be implemented in data centers having any number of racks, vents and air conditioning units without departing from the scope of the present invention.

The first rack 222 is illustrated as having a first inlet temperature sensor 230 and a first outlet temperature sensor 232. The second rack 224 is illustrated as having a second inlet temperature sensor 234 and a second outlet temperature sensor 236. The temperature sensors 230–236 are illustrated as communicating with the controller 204, and more particularly, the metrics module 216. The vent temperature sensor 226 is also illustrated as communicating with the metrics module 216. In addition, the air conditioning unit 228 is depicted as comprising an inlet temperature sensor 238 and an outlet temperature sensor 240, which are in communication with the metrics module 216.

The temperature sensors 226, 230–240 may comprise thermocouples, thermistors, or are otherwise configured to sense temperature and/or changes in temperature. The first and second inlet temperature sensors 230 and 234 are configured to detect temperatures of the cooling fluid entering through an inlet(s) of the first and second racks 222, 224, respectively. The first and second outlet temperature sensors 232, 236 are configured to detect temperatures of the heated air exhausting through the outlet(s) at various locations of the first and second racks 222, 224, respectively. The vent temperature sensor 226 is configured to detect the temperature of the cooling fluid delivered through a vent, e.g., vent 116. The inlet temperature sensor 238 and the outlet temperature sensor 240 are configured to detect the respective temperatures of heated airflow into and cooling fluid out of the air conditioning unit 228.

The controller 204 may receive detected temperatures from the sensors 226 and 230–240 through wired connections or through wireless protocols, such as IEEE 801.11b, 801.11g, wireless serial connection, Bluetooth, etc., or combinations thereof. The metrics module 216 may calculate one or both of the SHI and RHI values based upon the received detected temperatures. In one regard, the metrics module 216 may determine the SHI values and/or the RHI values at various locations of the data center 100. For example, the metrics module 216 may determine the SHI values and/or the RHI values for one or more components, one rack, a cluster of racks, multiple clusters of racks, or the entire data center. The metrics module 216 may also provide the SHI values and/or RHI values to the cooling system module 214 and the workload module 218.

According to an embodiment of the invention, and as described hereinabove with respect to co-pending U.S. patent application Ser. No. 10/620,272, the temperature sensors 226, 230–240 may comprise location aware devices. Through use of location aware devices as described in that application, the controller 204 may determine and store the locations of the various sensors. In addition, the controller 204 may wirelessly receive temperature information from the sensors and may be configured to substantially automatically determine the sensor locations in the event the data center is re-configured.

Figure 3:
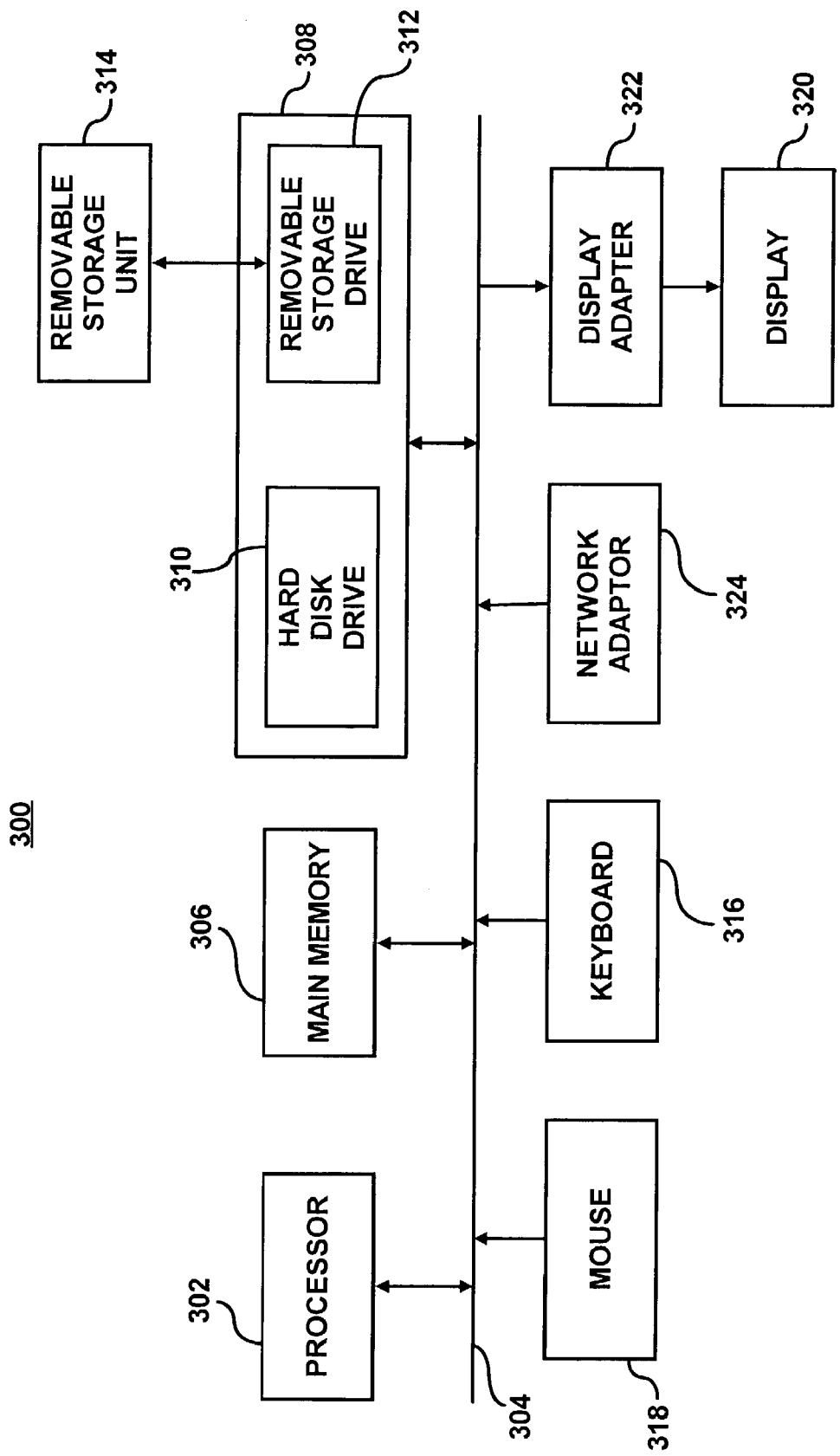
FIG. 3 illustrates an exemplary computer system according to an embodiment of the invention.

FIG. 3 illustrates an exemplary computer system 300, according to an embodiment of the invention. The computer system 300 may include the controller 204 shown in FIG. 2. In this respect, the computer system 300 may be used as a platform for executing one or more of the modules contained in the controller 204.

The computer system 300 includes one or more controllers, such as a processor 302. The processor 302 may be used to execute modules (e.g., modules 216–218 of the cooling system 202). Commands and data from the processor 302 are communicated over a communication bus 304. The computer system 300 also includes a main memory 306, e.g., memory 212, such as a random access memory (RAM), where the program code for the cooling system 202 may be executed during runtime, and a secondary memory 308. The secondary memory 308 includes, for example, one or more hard disk drives 310 and/or a removable storage drive 312, representing a floppy diskette drive, a magnetic tape drive, a compact disk drive, etc., where a copy of the program code for the provisioning system may be stored.

The removable storage drive 310 reads from and/or writes to a removable storage unit 314 in a well-known manner. User input and output devices may include a keyboard 316, a mouse 318, and a display 320. A display adaptor 322 may interface with the communication bus 304 and the display 320 and may receive display data from the processor 302 and convert the display data into display commands for the display 320. In addition, the processor 302 may communicate over a network, e.g., the Internet, LAN, etc., through a network adaptor 324.

It will be apparent to one of ordinary skill in the art that other known electronic components may be added or substituted in the computer system 300. In addition, the computer system 300 may include a system board or blade used in a rack in a data center, a conventional "white box" server or computing device, etc. Also, one or more of the components in FIG. 3 may be optional (e.g., user input devices, secondary memory, etc.).

Figure 4A:
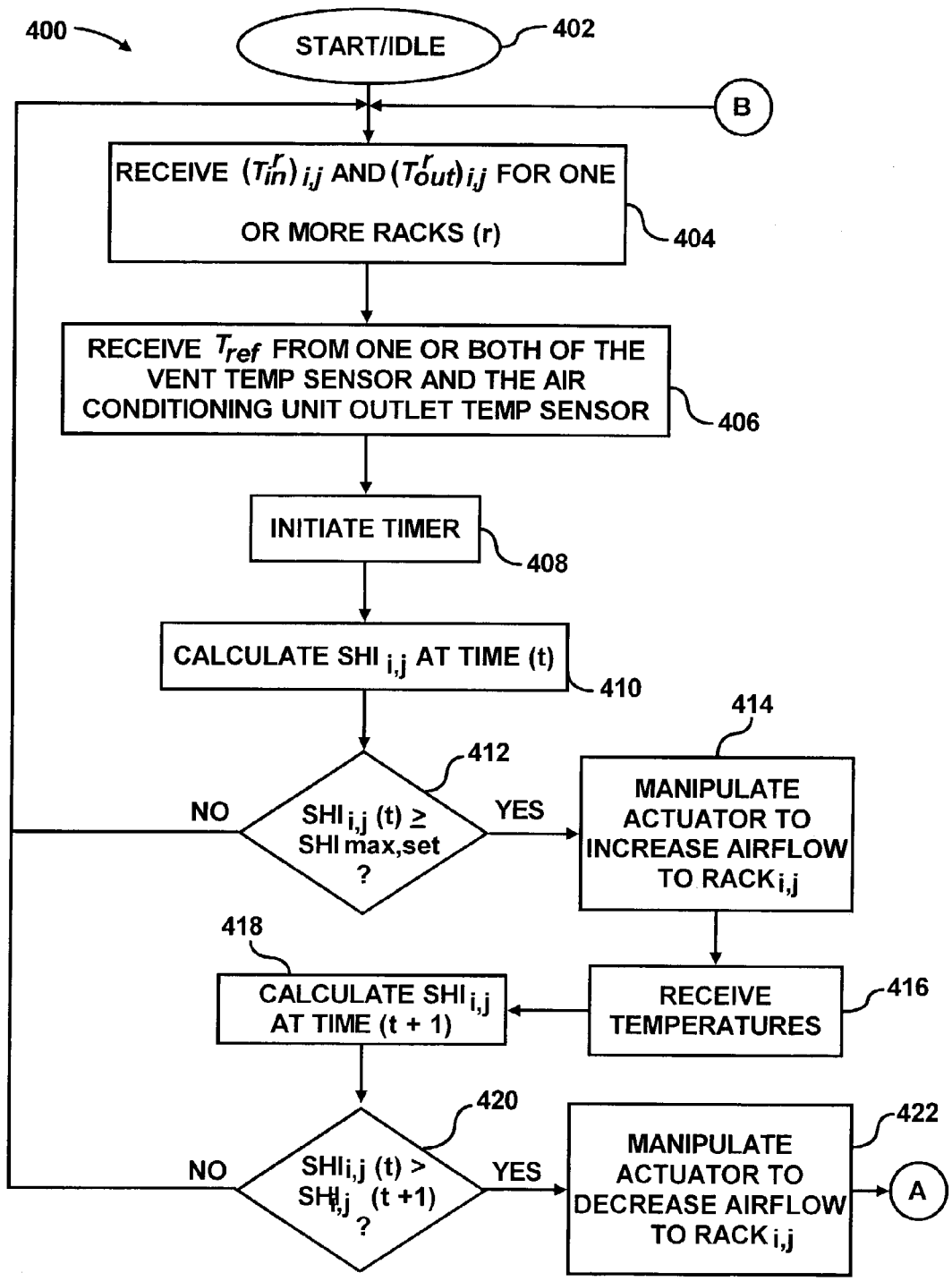
FIGS. 4A and 4B, collectively, illustrate an exemplary flow diagram of an operational mode of a cooling system according to an embodiment of the invention.
Figure 4B:
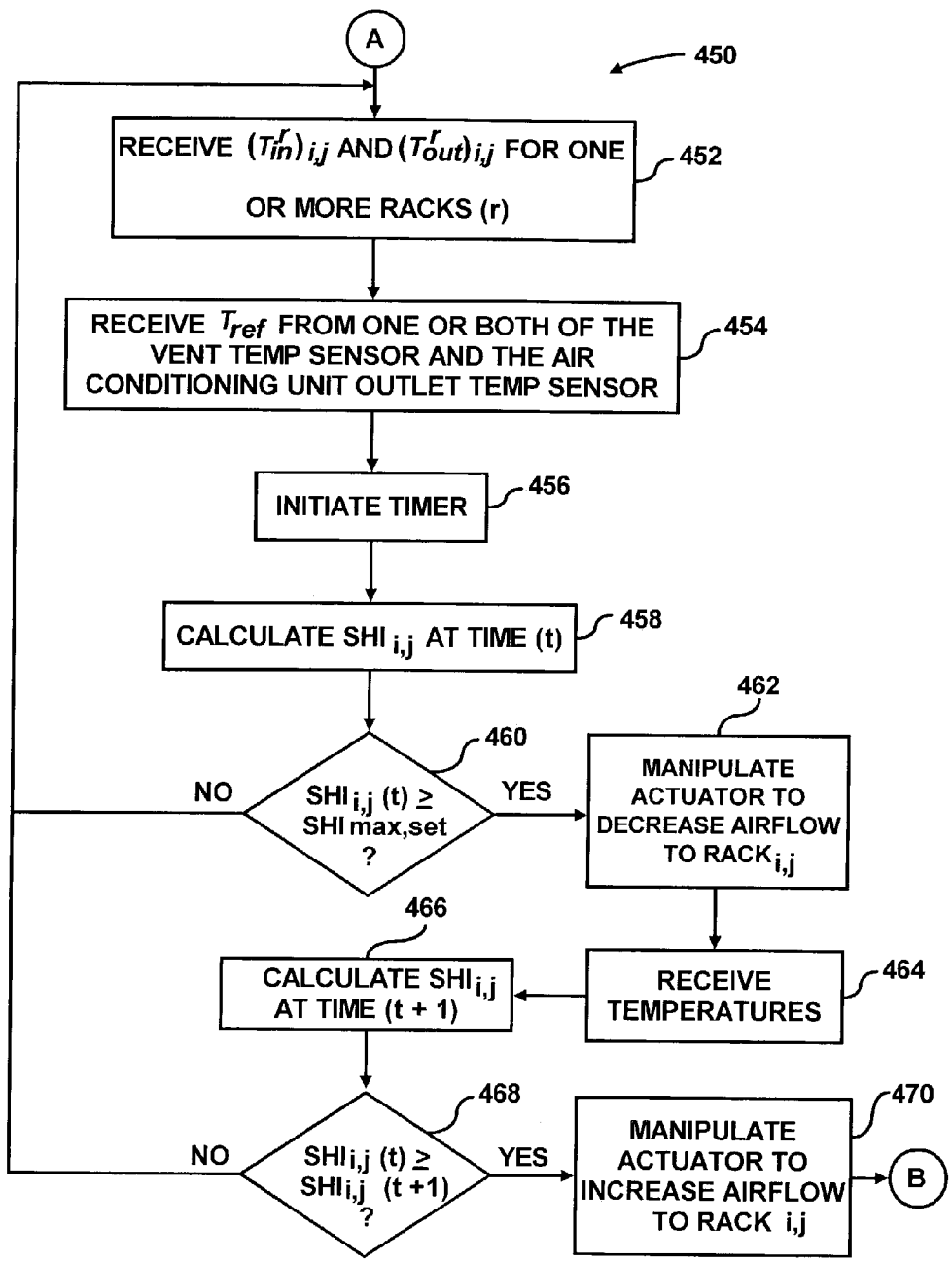

FIGS. 4A and 4B illustrate exemplary flow diagrams of operational modes 400 and 450 of a cooling system, e.g., cooling system 202, according to embodiments of the invention. It is to be understood that the following description of the operational modes 400 and 450 are but to manners of a variety of different manners in which embodiments of the invention may be operated. It should also be apparent to those of ordinary skill in the art that the operational modes 400 and 450 represent generalized illustrations and that other steps may be added or existing steps may be removed or modified without departing from the scope of the invention. The description of the operational modes 400 and 450 are made with reference to the block diagram 200 illustrated in FIG. 2, and thus makes reference to the elements cited therein.

The operations illustrated in the operational modes 400 and 450 may be contained as a utility, program, or a subprogram, in any desired computer accessible medium. In addition, the operational modes and 400 and 450 may be embodied by a computer program, which can exist in a variety of forms both active and inactive. For example, they can exist as software program(s) comprised of program instructions in source code, object code, executable code or other formats. Any of the above can be embodied on a computer readable medium, which include storage devices and signals, in compressed or uncompressed form.

Exemplary computer readable storage devices include conventional computer system RAM, ROM, EPROM, EEPROM, and magnetic or optical disks or tapes. Exemplary computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that any electronic device capable of executing the above-described functions may perform those functions enumerated below.

The controller 204 may implement the operational mode 400 to control airflow through the data center 100 based upon calculated SHI values. The operational mode 400 may be initiated in response to a variety of stimuli at step 402. For example, the operational mode 400 may be initiated in response to a predetermined lapse of time, in response to receipt of a transmitted signal, and/or in response to a detected change in an environmental condition (e.g., temperature, humidity, location, etc.).

At step 404, the controller 204 may receive rack inlet temperature measurements from the inlet temperature sensors 230 and 234. The controller 204 may also receive rack outlet temperature measurements from the outlet temperature sensors 232 and 236. It should be understood that the controller 204 may receive the inlet and outlet temperature measurements from any number of racks, e.g., racks 102–108, at step 404.

At step 406, the controller 204 may receive a reference temperature $T_{ref}$ from one or both of the vent temperature sensor 226 and the air conditioning unit outlet temperature sensor 240. Under ideal conditions, e.g., no heat transfers into the cooling fluid as it travels from the air conditioning unit outlet to the vent, the temperature of the cooling fluid at the air conditioning unit outlet and the vent are identical. The reference temperature $T_{ref}$ may be considered as either the temperature of the cooling fluid at the outlet of the air conditioning unit or at the vent. It should be understood that either temperature may be used in determining the SHI values.

In addition, when HEU's 150 and 152 are used in the data center 100 to supply the racks 102–108 with cooling fluid, the reference temperature $T_{ref}$ may be considered as a temperature of the cooling fluid at the outlet of the HEU's 150 and 152. It should therefore be understood that this temperature may be used in determining the SHI values.

The controller 204 may initiate a timer at step 408 to track when the SHI value is calculated, as indicated at step 410. The timer may also be initiated prior to receipt of the temperature measurements at steps 404 and 406 to track when those measurements are received. At step 410, the controller 204, and more particularly, the metrics module 216 may perform the calculations listed hereinabove to determine the SHI values for the ith rack in the jth row. As stated hereinabove, the SHI values may be calculated based upon the rack inlet temperatures, the rack outlet temperatures, and the reference temperatures. In addition, step 410 and the steps that follow may be performed for individual racks, clusters of racks (e.g., all the racks in a particular row), or all of the racks in a data center.

At step 412, the metrics module 216 may determine whether the calculated SHI values exceed or equal a maximum set SHI value (SHImax,set). The maximum set SHI value may be stored in the memory 212 and may be defined as a threshold SHI value that the controller 204 may use in determining whether to manipulate actuators that affect airflow through the racks. The maximum set SHI value may be selected according to a plurality of factors. These factors may include, for example, acceptable re-circulation levels, functional limits of the data center configuration, etc. In addition, the maximum set SHI values may vary from one rack to another or from one cluster of racks to another.

In addition, the metrics module 216 may determine the level of rise in SHI values. This determination may be made based upon, for example, previous SHI value calculations for a given component, rack, and/or clusters of racks. If an above-normal rise in SHI value is determined, the controller 204 may operate to cause an alarm to be sounded or otherwise signal that such a rise in SHI value has occurred. The level at which a SHI value is determined to be above-normal may depend upon a plurality of factors and may vary from component to component, rack to rack, and/or clusters of racks to other clusters of racks. Some of these factors may include, the positioning of the components or racks, the airflow characteristics in the locations of the components for the racks, acceptable heat dissipation characteristics, etc.

Thus, some of the racks or areas of the data center may have SHI values that are below the maximum set SHI value whereas other racks or areas of the data center may have SHI values that exceed their respective maximum set SHI values. For those racks or rack clusters having SHI values that fall below the maximum set SHI value, steps 404–412 may be repeated. These steps may be repeated in a substantially continuous manner. Alternatively, the controller 204 may enter into an idle or sleep state as indicated at step 402 and may initiate the control scheme 400 in response to one or more of the conditions set forth above.

For those racks or rack clusters that have SHI values that equal or exceed the maximum set SHI value, the controller 204 may manipulate one or more actuators 206a, 206b, 208a, 208b to increase the airflow through one or more of those racks or rack clusters at step 414. As stated hereinabove, the actuators 206a and 206b may be configured to vary the flow of air through respective racks 222 and 224. In this regard, the actuators 206a and 206b may control operation of movable louvers as set forth in co-pending U.S. patent application Ser. No. 10/425,621 and/or angled panels as set forth in co-pending U.S. patent application Ser. No. 10/425,624. In addition the vent actuator 208a may control delivery of cooling fluid to the cool aisles 118 to be supplied to the racks 222 and 224 as set forth in co-pending U.S. patent application Ser. Nos. 09/970,707 and 10/375,003.

Also, at step 414, the controller 204, and more specifically, the metrics module 216, may determine the level to which one or more actuators 206a, 206b, 208a, 208b is to be manipulated. This determination may be based upon past performance considerations. For example, the controller 204 may store in the memory 212, calculated SHI values for various actuator 206a, 206b, 208a, 208b manipulations for a given component, rack, and/or clusters of racks. The metrics module 216 may utilize this information in determining the level of actuator 206a, 206b, 208a, 208b manipulation.

At step 416, the controller 204 may receive temperature measurements again from the sensors 226, 230–236, 240 at a later time than at step 404, e.g., at time t+1. These temperature measurements are used to calculate the SHI values at time t+1, as indicated at step 418. The SHI values calculated at time t are compared with the SHI values calculated at time t+1 to determine whether the manipulation(s) performed at step 414 produced the intended effect of reducing SHI and therefore reducing re-circulation of heated air into the cooling fluid, at step 420.

If the SHI value has been reduced, i.e., the SHI value at time t exceeds the SHI value at time t+1, the controller 204 may repeat steps 404–420. These steps may be repeated according to a pre-set time schedule, or they may be repeated for so long as the data center and therefore the cooling system, is operational. Alternatively, the controller 204 may enter into an idle or sleep state as indicated at step 402 and may initiate the operational mode 400 in response to one or more of the conditions set forth above.

If the SHI value has not been reduced, i.e., the SHI value at time t is less than or equal to the SHI value at time t+1, it may be determined that the manipulation of the actuator(s) 206a, 206b, 208a, 208b actually caused a rise in the SHI value. Thus, at step 422, the controller 204 may manipulate one or more of the actuators 206a, 206b, 208a, 208b to decrease the airflow through the racks. In one respect, the rise in SHI values could be an indication that re-circulation of the heated air with the cooling fluid may have increased due to the increased airflow through the racks. In this case, a second scheme (operational mode 450) may be invoked as illustrated in FIG. 4B, which will be described in greater detail hereinbelow.

According to the operational mode 400 illustrated in FIG. 4A, which will be considered as the first scheme, when the SHI values exceed or equal the maximum set SHI value, cooling fluid delivery to the racks may be increased (steps 404–414).

FIG. 4B illustrates the second scheme, operational mode 450, in the situation where the first scheme does not produce the intended effect of reducing SHI values. The second scheme may be initiated after step 422 of the first control scheme. In general, according to the second scheme, the controller 204 operates in a substantially opposite manner to that of the first scheme. That is, for example, under the second scheme, the controller 204 may manipulate the actuator(s) 206a, 206b, 208a, 208b to decrease the cooling fluid flow to the racks in response to the SHI values at time t exceeding or equaling the maximum set SHI value.

As illustrated in FIG. 4B, at steps 452 and 454, the controller 204 may again receive temperature information from the sensors 226, 230–236, 240. In addition, the controller 204 may initiate a timer prior to calculating the SHI values for the ith rack in the jth row from the detected temperature information or the controller 204 may initiate the timer when it receives the temperature information at step 456. At step 456, the controller 204, and more particularly, the metrics module 216 may perform the calculations listed hereinabove to determine the SHI values. In addition, step 456 and the steps that follow may be performed for individual racks, clusters of racks (e.g., all the racks in a particular row), or all of the racks in a data center. At step 460, the controller 204 may compare the calculated SHI values with the maximum set SHI value to determine whether the SHI values are below a desired value.

For those racks or rack clusters having SHI values that fall below the maximum set SHI value, steps 452–460 may be repeated. These steps may be repeated in a substantially continuous manner. Alternatively, the controller 204 may enter into an idle or sleep state, e.g., step 402, and may initiate the operational mode 450 in response to one or more of the conditions set forth above with respect to step 402.

For those racks or rack clusters that have SHI values that equal or exceed the maximum set SHI value, the controller 204 may manipulate one or more actuators 206a, 206b, 208a, 208b to decrease the airflow through one or more of those racks or rack clusters at step 462. As stated hereinabove, the actuators 206a and 206b may be configured to vary the flow of air through respective racks 222 and 224. In this regard, the actuators 206a and 206b may control operation of movable louvers as set forth in co-pending U.S. patent application Ser. No. 10/425,621 and/or angled panels as set forth in co-pending U.S. patent application Ser. No. 10/425,624. In addition the vent actuator 208a may control delivery of cooling fluid to the cool aisles 18 to be supplied to the racks 222 and 224 as set forth in co-pending U.S. patent application Ser. Nos. 09/970,707 and 10/375,003.

At step 464, the controller 204 may receive temperature measurements again from the sensors 226, 230–236, 240 at a later time than at step 452, e.g., at time t+1. These temperature measurements are used to calculate the SHI values at time t+1, as indicated at step 466. The SHI values calculated at time t are compared with the SHI values calculated at time t+1 to determine whether the manipulation(s) performed at step 462 produced the intended effect of reducing SHI and therefore re-circulation of heated air into the cooling fluid, at step 468.

If the SHI has been reduced, that is, the SHI value at time t exceeds the SHI value at time t+1, the controller 204 may repeat steps 452–468. These steps may be repeated according to a pre-set time schedule, or they may be repeated for so long as the data center and therefore the cooling system, is operational. Alternatively, the controller 204 may enter into an idle or sleep state, e.g., step 402, and may initiate the operational mode 450 in response to one or more of the conditions set forth above with respect to step 402.

If the SHI has not been reduced, i.e., the SHI value at time t is less than or equal to the SHI value at time t+1, it may be determined that the manipulation of the actuator(s) 206a, 206b, 208a, 208b actually caused a rise in the SHI value. Thus, at step 470, the controller 204 may manipulate one or more of the actuators 206a, 206b, 208a, 208b to increase the airflow through the racks. In one respect, the rise in SHI values could be an indication that re-circulation of the heated air with the cooling fluid may have been increased due to the decreased airflow through the racks. In this case, the first scheme (operational mode 400) may be invoked as illustrated in FIG. 4A.

Through implementation of the operational mode 450 in response to the first scheme producing an undesirable result and implementation of the operational mode 450 in response to the second scheme producing an undesirable result, the controller 204 may substantially learn an optimized manner of operating the actuators 206a, 206b, 208a, and 208b in response to various SHI value calculations. In this regard, the controller 204 may substantially adapt to changing conditions in the data center that may cause changing SHI values.

The first and second schemes may be repeated any number times, e.g., as long as the data center is operational, at predetermined time intervals, etc. Thus, the controller 204 may vary the cooling fluid delivery into the racks as SHI values change for various sections of the data center. In addition, the controller 204 may vary the airflow through the racks according to an iterative process. That is, the controller 204 may alter the airflow by a predetermined amount each time a change is warranted and repeat this process until the SHI values are below the maximum set SHI value.

In one regard, by controlling the cooling fluid delivery to reduce the SHI values and therefore to reduce re-circulation of heated air into the cooling fluid, the amount of energy required to maintain the temperatures of the components in the racks within predetermined ranges may substantially be optimized.

Figure 4C:
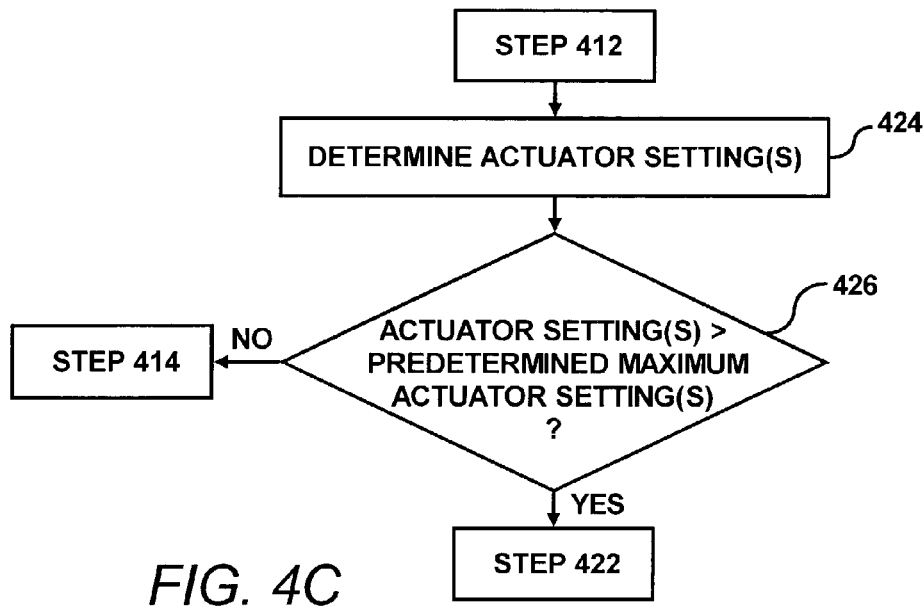
FIGS. 4C and 4D illustrate optional steps of the operational modes illustrated in FIGS. 4A and 4B, respectively, according to alternative embodiments of the invention.
Figure 4D:
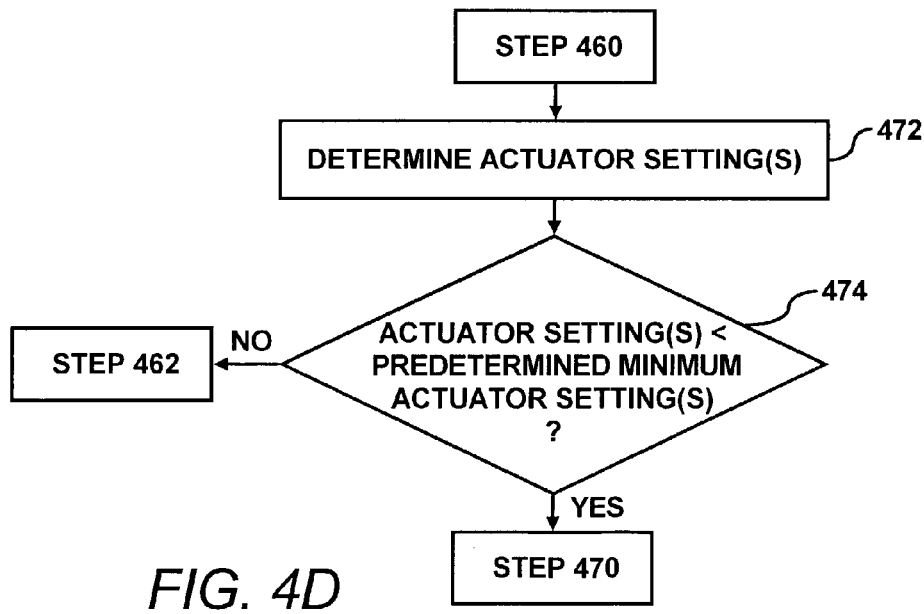

FIGS. 4C and 4D illustrate optional steps of the operational modes illustrated in FIGS. 4A and 4B, respectively, according to alternative embodiments of the invention. With reference first to FIG. 4C, there is shown steps 424 and 426 that may be performed in place of steps 414–420. According to this embodiment, following step 412, the settings of the one or more actuators 206a, 206b, 208a, 208b may be determined at step 424. The actuator settings may be based upon, for example, the degree to which a supply vent is open, the angle of an angled panel, the angles of movable louvers, etc. Thus, for example, the airflow through the vent and one or more racks may be determined according to the actuator settings.

At step 426, the determined actuator settings are compared to predetermined maximum actuator settings. The predetermined maximum actuator settings may be based upon a plurality of factors. For instance, the predetermined maximum actuator settings may correlate to the maximum open position of the above-described airflow devices. Alternatively, the predetermined maximum actuator settings may correlate to a desired level of airflow through the airflow devices. That is, for example, the predetermined maximum actuator settings may be set to substantially prevent potentially damaging levels of airflow through the one or more racks, such as, a situation where there is little or no airflow through the one or more racks.

If the determined actuator settings are greater than the predetermined maximum actuator settings, the controller 204 may manipulate the one or more actuators 206a, 206b, 208a, 208b to decrease the airflow to the one or more racks at step 422. Alternatively, if the determined actuator settings are below the predetermined maximum actuator settings, the controller 204 may manipulate the one or more actuators 206a, 206b, 208a, 208b to increase the airflow to the one or more racks at step 414.

With reference now to FIG. 4D, there is shown steps 472 and 474 that may be performed in place of steps 462–468. According to this embodiment, following step 460, the settings of the one or more actuators 206a, 206b, 208a, 208b may be determined at step 472. The actuator settings may be based upon, for example, the degree to which a supply vent is open, the angle of an angled panel, the angles of movable louvers, etc. Thus, for example, the airflow through the vent and one or more racks may be determined according to the actuator settings.

At step 474, the determined actuator settings are compared to predetermined minimum actuator settings. The predetermined minimum actuator settings may be based upon a plurality of factors. For instance, the predetermined minimum actuator settings may correlate to the minimum open position of the above-described airflow devices. Alternatively, the predetermined minimum actuator settings may correlate to a desired level of airflow through the airflow devices. That is, for example, the predetermined minimum actuator settings may be set to substantially prevent potentially damaging levels of airflow through the one or more racks, such as, a situation where there is little or no airflow through the one or more racks. If the determined actuator settings are less than the predetermined minimum actuator settings, the controller 204 may manipulate the one or more actuators 206a, 206b, 208a, 208b to increase the airflow to the one or more racks at step 470. Alternatively, if the determined actuator settings are above the predetermined minimum actuator settings, the controller 204 may manipulate the one or more actuators 206a, 206b, 208a, 208b to decrease the airflow to the one or more racks at step 462.

After performing the steps indicated in the operational modes 400 and 450, the controller 204 may determine which of the operational modes 400 and 450 to perform when changes to SHI are detected. For example, the controller 204 may implement operational mode 400 when a prior performance of operational mode 400, e.g., steps 402–420, resulted in a reduction in SHI for a component, rack, or cluster of racks. Alternatively, the controller 204 may implement operational mode 450 when a prior performance of operational mode 450, e.g., steps 452–468, resulted in a reduction in SHI for a component, rack, or cluster of racks. In addition, the controller 204 may implement either operational mode 400 or 450 in response to SHI determinations for various components, racks, or clusters of racks. In one regard, the controller 204 essentially learns which operational mode 400 or 450 to perform, e.g., manipulating the one or more actuators to increase or decrease airflow in response to calculated SHI's exceeding the predetermined maximum set SHI.

Figure 5:
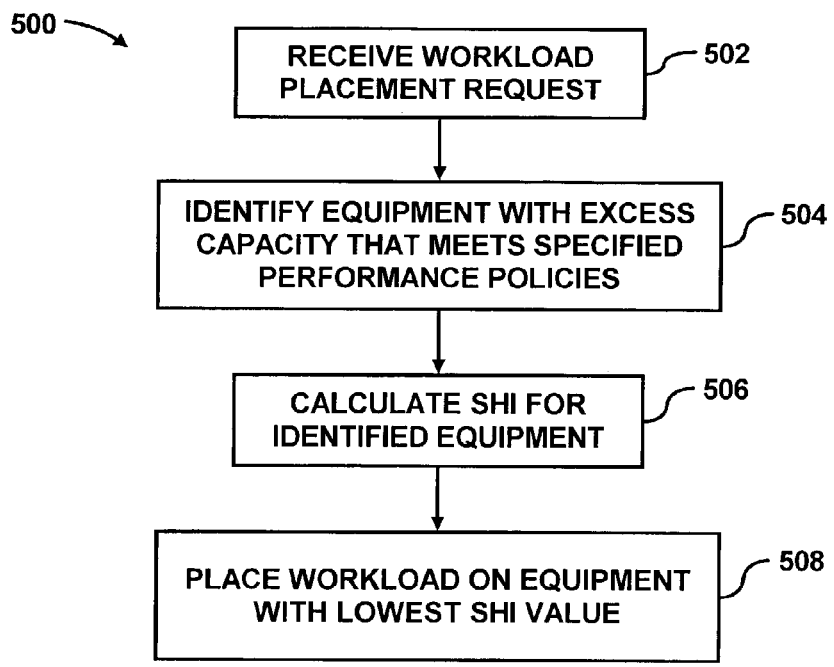
FIG. 5 illustrates an exemplary flow diagram of an operational mode of a cooling system according to an embodiment of the invention.

FIG. 5 illustrates an exemplary flow diagram of an operational mode 500 of a cooling system, e.g., cooling system 202, according to an embodiment of the invention. It is to be understood that the following description of the operational mode 500 is but one manner of a variety of different manners in which an embodiment of the invention may be operated. It should also be apparent to those of ordinary skill in the art that the operational mode 500 represents a generalized illustration and that other steps may be added or existing steps may be removed or modified without departing from the scope of the invention. The description of the operational mode 500 is made with reference to the block diagram 200 illustrated in FIG. 2, and thus makes reference to the elements cited therein.

The operations illustrated in the operational mode 500 may be contained as a utility, program, or a subprogram, in any desired computer accessible medium. In addition, the operational mode 500 may be embodied by a computer program, which can exist in a variety of forms both active and inactive. For example, they can exist as software program(s) comprised of program instructions in source code, object code, executable code or other formats. Any of the above can be embodied on a computer readable medium, which include storage devices and signals, in compressed or uncompressed form.

Exemplary computer readable storage devices include conventional computer system RAM, ROM, EPROM, EEPROM, and magnetic or optical disks or tapes. Exemplary computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that any electronic device capable of executing the above-described functions may perform those functions enumerated below.

The controller 204 may implement the operational mode 500 to control workload through various servers 220 based upon calculated SHI values. The operational mode 500 may be initiated in response to receipt of a workload placement request at step 502. For example, the operational mode 500 may be initiated in response to a request for work to be performed by one or more servers 220.

At step 504, the controller 204, and more particularly the workload module 218 may identify equipment, e.g., one or more servers 220, that have excess capacity that the meets specified performance policies. For example, the workload module 218 may determine which servers 220 are capable of performing the requested task.

At step 506, the workload module 218 may receive SHI values for the equipment identified in step 504. The workload module 218 may receive this information from the metrics module 218 which may calculate the SHI values in the manners described hereinabove. In addition, the workload module 218 may request that the workload module 218 perform the SHI calculations in response to receipt of the workload request.

The workload module 218 may place the workload on one or more equipment having the lowest SHI value at step 508. In this regard, the efficiency of the heat transfer from the equipment in the racks to the cooling fluid may substantially be optimized.

Figure 6:
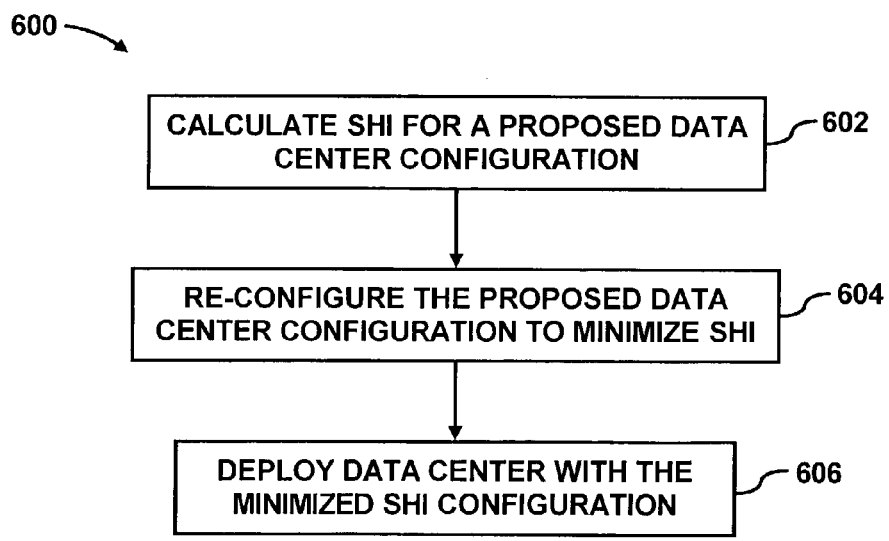
FIG. 6 illustrates an exemplary flow diagram of an operational mode for designing and deploying a data center layout according to an embodiment of the invention.

FIG. 6 illustrates an exemplary flow diagram of an operational mode 600 for designing and deploying a data center layout according to an embodiment of the invention. It is to be understood that the following description of the operational mode 600 is but one manner of a variety of different manners in which an embodiment of the invention may be operated. It should also be apparent to those of ordinary skill in the art that the operational mode 600 represents a generalized illustration and that other steps may be added or existing steps may be removed or modified without departing from the scope of the invention.

Some of the steps outlined in the operational mode 600 may be performed by software stored, for example, in the memory 212, and executed by the controller 204. The software may comprise a computational fluid dynamics (CFD) tool designed to calculate airflow dynamics at various locations of a proposed data center based upon inputted temperatures. The CFD tool may be programmed to determine SHI values for various sections of the data center according to predicted temperatures at rack inlets and outlets, as well as predicted reference temperatures.

At step 602, based upon the proposed layout or configuration of the data center as well as the proposed heat generation in the racks, SHI values may be calculated. According to the calculated SHI values, the layout or configuration of the data center may be re-configured to minimize SHI values at step 604. Step 604 may comprise an iterative process in which various data center configurations are inputted into the tool to determine which layout results in the minimal SHI values. Once the layout is determined with the minimized SHI value configuration, the data center having this layout may be deployed at step 606.

As described in greater detail in the co-pending applications listed hereinabove, the CFD tool may be implemented to monitor the temperature of air as well as the airflow in the data center 100. According to an embodiment of the present invention, the CFD tool may be implemented to calculate SHI values for various sections of the data center 100 to thus determine the level of heated air re-circulation in the data center 100. For example, the temperatures of the cooling fluid delivered into the racks, the temperatures of the heated air exhausted from the racks, and the reference temperature may be inputted into the CFD tool. The CFD tool may calculate the SHI values with the inputted temperature information in a manner similar to the equations set forth hereinabove. The CFD tool may further create a numerical model of the SHI values in the data center 400. The numerical model of the SHI values may be used in creating a map of the SHI values throughout various sections of the data center 100.

By comparing the numerical models of SHI values throughout the data center 100 at various times, the CFD tool may determine changes in SHI values in the data center 100. If the numerical models of the SHI values indicate that the cooling fluid is re-circulating with the heated air, the controller 204 may manipulate one or more actuators 206a, 206b, 208a, 208b to reduce or eliminate the re-circulation in the manners described hereinabove with respect to FIGS. 4A and 4B.

As described in co-pending and commonly assigned Application Ser. No. 10/345,723, filed on Jan. 16, 2003 and entitled "Agent Based Control Method and System for Energy Management" the disclosure of which is hereby incorporated by reference in its entirety, the actuator 206a, 206b, 208a, 208b movements may be considered as resources that may be traded or allocated among rack agents to distribute cooling fluid. These resources may be at the lowest tier of the resource pyramid and may be allocated first in response to a control signal. The multi-tiered and multi-agent control system may be driven by appropriate temperature conditions, deviations, and the rack operating parameters.

By virtue of certain embodiments of the present invention, the amount of energy, and thus the costs associated with maintaining environmental conditions within a data center within predetermined operating parameters, may be substantially reduced. In one respect, by operating the cooling system in manners that substantially reduce SHI values, the cooling system may be operated at a relatively more efficient manner in comparison with conventional cooling systems.

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A method for controlling air re-circulation in a data center, said method comprising:
   receiving inlet temperatures and outlet temperatures for one or more racks, said one or more racks comprising inlets and outlets;
   receiving a reference temperature;
   calculating a first index value of air re-circulation based on the inlet and outlet temperatures and the reference temperature, wherein the step of calculating the first index value of air-recirculation comprises:
      determining an enthalpy rise due to infiltration of heated air into the inlets of the one or more racks;
      determining a total enthalpy rise of the heated air from the outlets of the one or more racks; and
      dividing the enthalpy rise due to infiltration of heated air into the inlets of the one or more racks by the total enthalpy rise of the heated air from the outlets of the one or more racks; and
   manipulating one or more actuators in response to the calculated first index value of air re-circulation to thereby control air re-circulation in the data center.

2. The method according to claim 1, wherein the step of calculating the first index value of air-recirculation (SHI) comprises solving for the following equation:

$$SHI = \frac{\delta Q}{Q + \delta Q},$$

wherein Q represents a total heat dissipation from components housed in the one or more racks and δQ represents a rise in enthalpy of the cooling fluid before entering the one or more racks.

3. The method according to claim 1, wherein the step of calculating the first index value of air-recirculation (SHI) comprises solving for the following equation:

$$SHI = \left[ \frac{\sum_j \sum_i ((T_{in}^r)_{i,j} - T_{ref})}{\sum_j \sum_i ((T_{out}^r)_{i,j} - T_{ref})} \right],$$

wherein $(T_{in}^r)_{i,j}$ and $(T_{out}^r)_{i,j}$ are average inlet and outlet temperatures from the ith rack and the jth row of racks, and $T_{ref}$ denotes a reference temperature.

4. The method according to claim 1, wherein said reference temperature is received from at least one of a vent temperature sensor and an air conditioning unit temperature sensor.

5. The method according to claim 1, further comprising:
   initiating a timer at least one of before receiving the inlet and outlet temperatures and calculating the first index of air re-circulation.

6. The method according to claim 1, further comprising:
   determining whether the first index of air re-circulation is equal to or above a maximum set index of air re-circulation.

7. The method according to claim 6, wherein said step of manipulating one or more actuators comprises manipulating the one or more actuators to increase airflow to the one or more racks in response to the first index of air re-circulation exceeding the maximum set index of air re-circulation.

8. The method according to claim 7, further comprising:
receiving a second set of inlet and outlet temperatures;
calculating a second index of air re-circulation;
determining whether the first index of re-circulation exceeds the second index of re-circulation; and
manipulating the one or more actuators to decrease airflow to the one or more racks in response to the first index exceeding the second index.

9. The method according to claim 8, further comprising:
initiating a control scheme comprising:
manipulating the one or more actuators to decrease airflow to the one or more racks in response to the first index exceeding the maximum set index.

10. The method according to claim 6, wherein said step manipulating one or more actuators comprises manipulating the one or more actuators to decrease airflow to the one or more racks in response to the first index of re-circulation exceeding the maximum set index of air re-circulation.

11. The method according to claim 10, further comprising:
receiving a second set of inlet and outlet temperatures;
calculating a second index of air re-circulation;
determining whether the first index of re-circulation exceeds the second index of re-circulation; and
manipulating the one or more actuators to increase airflow to the one or more racks in response to the first index exceeding the second index.

12. The method according to claim 11, further comprising:
initiating a control scheme comprising:
manipulating the one or more actuators to increase airflow to the one or more racks in response to the first index exceeding the maximum set index.

13. The method according to claim 1, further comprising:
comparing the first index of air re-circulation with a previously determined index of air re-circulation;
determining whether the first index of air re-circulation exceeds the previously determined index of air re-circulation by a predetermined level; and
providing an indication that the first index of air re-circulation exceeds the previously determined index of air re-circulation by the predetermined level.

14. The method according to claim 1, further comprising:
determining settings of the one or more actuators; and
comparing the settings of the one or more actuators with at least one of a predetermined maximum actuator setting and a predetermined minimum actuator setting.

15. The method according to claim 14, wherein the step of manipulating the one or more actuators comprises manipulating the one or more actuators to increase airflow to the one or more racks in response to the settings of the one or more actuators falling below the predetermined maximum actuator setting.

16. The method according to claim 14, wherein the step of manipulating the one or more actuators comprises manipulating the one or more actuators to decrease airflow to the one or more racks in response to the settings of the one or more actuators exceeding the predetermined maximum actuator setting.

17. The method according to claim 14, wherein the step of manipulating the one or more actuators comprises manipulating the one or more actuators to decrease airflow to the one or more racks in response to the settings of the one or more actuators exceeding the predetermined minimum actuator setting.

18. The method according to claim 14, wherein the step of manipulating the one or more actuators comprises manipulating the one or more actuators to increase airflow to the one or more racks in response to the settings of the one or more actuators falling below the predetermined minimum actuator setting.

19. A system for controlling air re-circulation in a data center, said system comprising:
means for calculating an index of air re-circulation in one or more areas of the data center, wherein the index of air re-circulation is a measure of heated air infiltration into cooling fluid supplied into the one or more areas, said means for calculating being configured to determine an enthalpy rise due to infiltration of heated air supplied into one or more racks, to determine a total enthalpy rise of the heated air exhausted from one or more racks, and to divide die enthalpy rise due to infiltration by the total enthalpy rise to calculate the index of air re-circulation; and
means for reducing air re-circulation in the one or more areas of the data center in response to the index calculated by the means far calculating an index of air re-circulation.

20. The system according to claim 19, wherein the means for reducing air re-circulation comprises means for varying air flow through one or more racks.

21. The system according to claim 19, wherein the means for reducing air re-circulation comprises means for varying air flow through one or more racks.

22. The system according to claim 19, wherein the mans for reducing air re-circulation comprises:
means for designing the data center to comprise a configuration that provides a minimal index of re-circulation; and
means for deploying the data center with the minimal index of re-circulation configuration.

23. A computer readable storage medium on which is embedded one or more computer programs, said one or more computer programs implementing a method of controlling re-circulation of air in a data center, said one or more computer programs comprising a set of instructions for:
receiving inlet temperatures and outlet temperatures for one or more racks;
receiving a reference temperature;
calculating a first index value off air re-circulation based on the inlet and outlet temperatures and the reference temperature, wherein calculating the first index value of air re-circulation comprises:
determining an enthalpy rise due to infiltration of heated air into the inlets or the one or more racks;
determining a total enthalpy rise of the heated air from the outlets of the one or more racks; and
dividing the enthalpy rise due to infiltration of heated air into the inlets of the one or more racks by the total enthalpy rise of the heated air from the outlets of the one or more rack; and
manipulating one or more actuators in response to the calculated first index value of air re-circulation to thereby control air re-circulation in the data center.

24. The computer readable storage medium according to claim 23, said one or more computer programs further comprising a set of instructions for:
determining whether the first index of air re-circulation is equal to or above a maximum set index of air re-circulation.

25. The computer readable storage medium according to claim 24, said one or more computer programs further comprising a set of instructions for:

manipulating the one or more actuators to increase airflow to the one or more racks in response to the first index of air re-circulation exceeding the maximum set index of air re-circulation.

26. The computer readable storage medium according to claim 25, said one or more computer programs further comprising a set of instructions for:

receiving a second set of inlet and outlet temperatures;

calculating a second index of air re-circulation;

determining whether the first index of re-circulation exceeds the second index of re-circulation; and manipulating the one or more actuators to decrease airflow to the one or more racks in response to the first index exceeding the second index.

27. The computer readable storage medium according to claim 26, said one or more computer programs further comprising a set of instructions for:

initiating a control scheme comprising:

manipulating the one or more actuators to decrease airflow to the one or more racks in response to the first index exceeding the maximum set index.

28. The computer readable storage medium according to claim 25, said one or more computer programs further comprising a set of instructions for:

manipulating the one or more actuators to decrease airflow to the one or more racks in response to the first index of re-circulation exceeding the maximum set index of air re-circulation.

29. The computer readable storage medium according to claim 28, said one or more computer programs further comprising a set of instructions for:

receiving a second set of inlet and outlet temperatures;

calculating a second index of air re-circulation;

determining whether the first index of re-circulation exceeds the second index of re-circulation; and manipulating the one or more actuators to increase airflow to the one or more racks in response to the first index exceeding the second index.

30. The computer readable storage medium according to claim 29, said one or more computer programs further comprising a set of instructions for:

initiating a control scheme comprising:

manipulating the one or more actuators to increase airflow to the one or more racks in response to the first index exceeding the maximum set index.

\* \* \* \* \*

UNITED STATES PATENT AND TRADEMARK OFFICE
CERTIFICATE OF CORRECTION

PATENT NO. : 7,051,946 B2
APPLICATION NO. : 10/446854
DATED : May 30, 2006
INVENTOR(S) : Cullen Edwin Bash et al.

Page 1 of 1

It is certified that error appears in the above-identified patent and that said Letters Patent is hereby corrected as shown below:

In column 4, line 61, delete "computional" and insert -- computational --, therefor, In column 19, line 36, delete "18" and insert -- 118 --, therefor.

In column 26, line 17, in Claim 19, delete "die" and insert -- the --, therefor.

In column 26, line 22, in Claim 19, delete "far" and insert -- for --, therefor.

In column 26, line 30, in Claim 21, delete "air flow through one or more racks." and insert -- placement on one or more servers. --, therefor.

In column 26, line 31, in Claim 22, delete "mans" and insert -- means --, therefor.

In column 26, line 46, in Claim 23, delete "off" and insert -- of --, therefor.

In column 26, line 51, in Claim 23, after "inlets" delete "or" and insert -- of --, therefor.

Signed and Sealed this

Eleventh Day of August, 2009

David J. Kappos
*Director of the United States Patent and Trademark Office*